(12) United States Patent
Lee et al.

(10) Patent No.: US 11,342,520 B2
(45) Date of Patent: May 24, 2022

(54) STRETCHABLE DISPLAY DEVICE

(71) Applicant: LG Display Co., Ltd., Seoul (KR)

(72) Inventors: Hyokang Lee, Paju-si (KR); Kihan Kim, Paju-si (KR)

(73) Assignee: LG Display Co., Ltd., Seoul (KR)

(*) Notice: Subject to any disclaimer, the term of this patent is extended or adjusted under 35 U.S.C. 154(b) by 94 days.

(21) Appl. No.: 16/795,175

(22) Filed: Feb. 19, 2020

(65) Prior Publication Data

US 2020/0343463 A1 Oct. 29, 2020

(30) Foreign Application Priority Data

Apr. 25, 2019 (KR) .......................... 10-2019-0048210

(51) Int. Cl.
*H01L 27/32* (2006.01)
*H01L 51/00* (2006.01)
*G09G 3/3225* (2016.01)

(52) U.S. Cl.
CPC ....... *H01L 51/0097* (2013.01); *G09G 3/3225* (2013.01); *H01L 27/3276* (2013.01); *H01L 2251/5338* (2013.01)

(58) Field of Classification Search
None
See application file for complete search history.

(56) References Cited

U.S. PATENT DOCUMENTS

| 9,287,341 B2* | 3/2016 | Cheon | H01L 27/3237 |
| 2016/0104756 A1* | 4/2016 | Lee | H01L 27/326 |
| | | | 257/40 |
| 2019/0207131 A1* | 7/2019 | Lu | H01L 51/5253 |
| 2019/0393278 A1* | 12/2019 | Wu | H01L 27/323 |
| 2021/0134196 A1* | 5/2021 | Niu | H01L 27/3276 |

* cited by examiner

*Primary Examiner* — Ali Naraghi
(74) *Attorney, Agent, or Firm* — Seed IP Law Group LLP

(57) ABSTRACT

A stretchable display devices includes a flexible substrate. A plurality of first substrates and a plurality of second substrates are disposed on the substrate. The plurality of first substrates are spaced from each other and the plurality of second substrates, and the plurality of second substrates are spaced from each other. A plurality of connection supports are coupled to the plurality of first and second substrates. Connection lines extend on the plurality of connection supports to form an electrical connection between the plurality of first substrates and the plurality of second substrates. A distance between one of the plurality of second substrates and a corresponding outer one of the plurality of first substrates is greater than a distance between the plurality of first substrates to reduce stress on the plurality of second substrates during bending or stretching of the display device.

10 Claims, 13 Drawing Sheets

STRETCHABLE DISPLAY DEVICE

CROSS-REFERENCE TO RELATED APPLICATION

This application claims the priority of Korean Patent Application No. 10-2019-0048210 filed on Apr. 25, 2019, in the Korean Intellectual Property Office, the disclosure of which is incorporated herein by reference, in its entirety.

BACKGROUND

Technical Field

The present disclosure relates to a stretchable display device, and more particularly, to a stretchable display device configured to reduce stress generated during stretching.

Description of the Related Art

Display devices used for a computer monitor, a TV, a mobile phone, etc., include an organic light-emitting display (OLED) that emits light without a separate light source or a liquid-crystal display (LCD) that requires a separate light source, among others.

As display devices have been increasingly applied to diverse fields such as a computer monitor, a TV, and a personal mobile device, display devices having a large display area and a reduced volume and weight have been studied, including stretchable or flexible display devices.

BRIEF SUMMARY

One or more embodiments of the present disclosure include a stretchable display device where a distance between a substrate in an active area and a substrate in a non-active area is increased to reduce stress concentrated on the substrate in the non-active area and connection lines during stretching.

One or more embodiments of the present disclosure include a stretchable display device with a dummy substrate disposed between a substrate in an active area and a substrate in a non-active area to reduce stress concentrated on the substrate in the non-active area and connection lines during stretching.

One or more embodiments of the present disclosure include a stretchable display device with symmetrically disposed connection substrates connected to other substrates to reduce the concentration of stress on connection lines disposed on the edges of the other substrates.

A stretchable display device according to one or more embodiments of the present disclosure includes: a support substrate including an active area and a non-active area; a plurality of first substrates on the support substrate in the active area; a plurality of second substrates on the support substrate in the non-active area; and a plurality of connection supports coupled to each of the plurality of first substrates and each of the plurality of second substrates.

The stretchable display device may further include: a distance between an outer one of the plurality of first substrates and a corresponding one of the plurality of second substrates being greater than a distance between the outer one of the plurality of first substrates and an inner one of the plurality of first substrates; a plurality of third substrates disposed in the non-active area, each of the plurality of third substrates connected to one of the plurality of second substrates and one of the plurality of first substrates by at least one of the plurality of connection supports; a distance between one of the plurality of second substrates and a corresponding one of the plurality of third substrates being greater than a distance between the corresponding one of the plurality of third substrates and a corresponding one of the plurality of first substrates; and a width of each of the plurality of third substrates being equal to a width of each of the plurality of first substrates and less than a width of each of the plurality of second substrates.

The stretchable display device may further include: a plurality of third substrates, a first one of the plurality of third substrates coupled to one of the plurality of second substrates by at least one of the plurality of connection supports, a second one of the plurality of third substrates connected to the first one of the plurality of third substrates by at least one of the plurality of connection supports, and a third one of the plurality of third substrates connected to the second one of the plurality of third substrates by at least one of the plurality of connection supports, the third one of the plurality of third substrates connected to one of the plurality of first substrates by at least one connection support of the plurality of connection supports; a distance between one of the plurality of second substrates and the first one of the plurality of third substrates being greater than a distance between the second one and the third one of the plurality of third substrates; and the distance between the first one and the second one of the plurality of third substrates being greater than a distance between a first one of the plurality of first substrates and a second one of the plurality of first substrates.

The stretchable display device may further include: a plurality of third substrates, the plurality of third substrates connected to corresponding ones of the plurality of first substrates and the plurality of second substrates with the plurality of connection supports, wherein a first one of the plurality of third substrates has a first width and a second one of the plurality of third substrates has a second width less than the first width; each of the plurality of second substrates including a first portion spaced from a second portion, at least one of the plurality of connection supports connected to the first portion and the second portion, the stretchable display device further comprising a first gate driver on the first portion, and a second gate driver on the second portion; and each of the plurality of first substrates including a transistor, a planarizing layer on the transistor, and a pad on the planarizing layer connected to the transistor, the stretchable display device further comprising a connection line on each of the plurality of connection supports, wherein the connection line of one of the plurality of connection supports is coupled to the pad of a first one and a second one of the plurality of first substrates.

A stretchable display device according to one or more embodiments of the present disclosure includes: a support substrate; a plurality of first substrates on the support substrate, each of the plurality of first substrates including a transistor, a planarizing layer on the transistor, and a connection line on the planarizing layer connected to the transistor; and a plurality of second substrates on the support substrate.

The stretchable display device may further include: a plurality of connection supports coupled to the plurality of first substrates and the plurality of second substrates, wherein the connection line of each of the plurality of first substrates is on one of the plurality of connection supports, wherein the plurality of connection supports are stretchable; the connection line of a first one of the plurality of first substrates being connected to the connection line of a second one of the plurality of first substrates; the connection line of the first one of the plurality of first substrates is connected to a corresponding one of the plurality of second substrates; a first one of the plurality of connection supports having a sine wave shape and a second one of the plurality of connection supports having an inverted sine wave shape; and each of the plurality of second substrates including a first portion and a second portion spaced from the first portion with a distance between the first portion and the second portion being equal to a distance between a first one of the plurality of first substrates and a second one of the plurality of second substrates.

The stretchable display device may further include: a plurality of third substrates, and a plurality of connection supports coupled to the plurality of first substrates, the plurality of second substrates, and the plurality of third substrates; each of the plurality of second substrates having a first width, a first one of the plurality of third substrates having a second width, a second one of the plurality of third substrates having a third width, and each of the plurality of first substrates having a fourth width, the first width being greater than the second width, the third width, and the fourth width; the second width being greater than the third width and the third width being equal to the fourth width; and the second width, the third width, and the fourth width being equal.

Embodiments of the present disclosure are not limited to the above-mentioned embodiments, and other embodiments, which are not mentioned above, can be clearly understood by those skilled in the art from the following disclosure.

According to the present disclosure, when a stretchable display device is stretched, it is possible to reduce stress concentrated on a substrate in a non-active area and connection lines connected thereto, in one or more embodiments.

According to the present disclosure, when a stretchable display device is stretched, it is possible to reduce the likelihood of damage to a substrate in a non-active area and connection lines due to stress, in one or more embodiments.

According to the present disclosure, connection lines are disposed on the edges of substrates, and, thus, it is possible to reduce the likelihood of damage to the connection lines, in one or more embodiments.

The advantages according to the present disclosure are not limited to the contents exemplified above, and other advantages are included in the present disclosure.

BRIEF DESCRIPTION OF THE DRAWINGS

The above and other aspects, features and advantages of the present disclosure will be more clearly understood from the following detailed description taken in conjunction with the accompanying drawings, in which.

DETAILED DESCRIPTION

Figure 1:
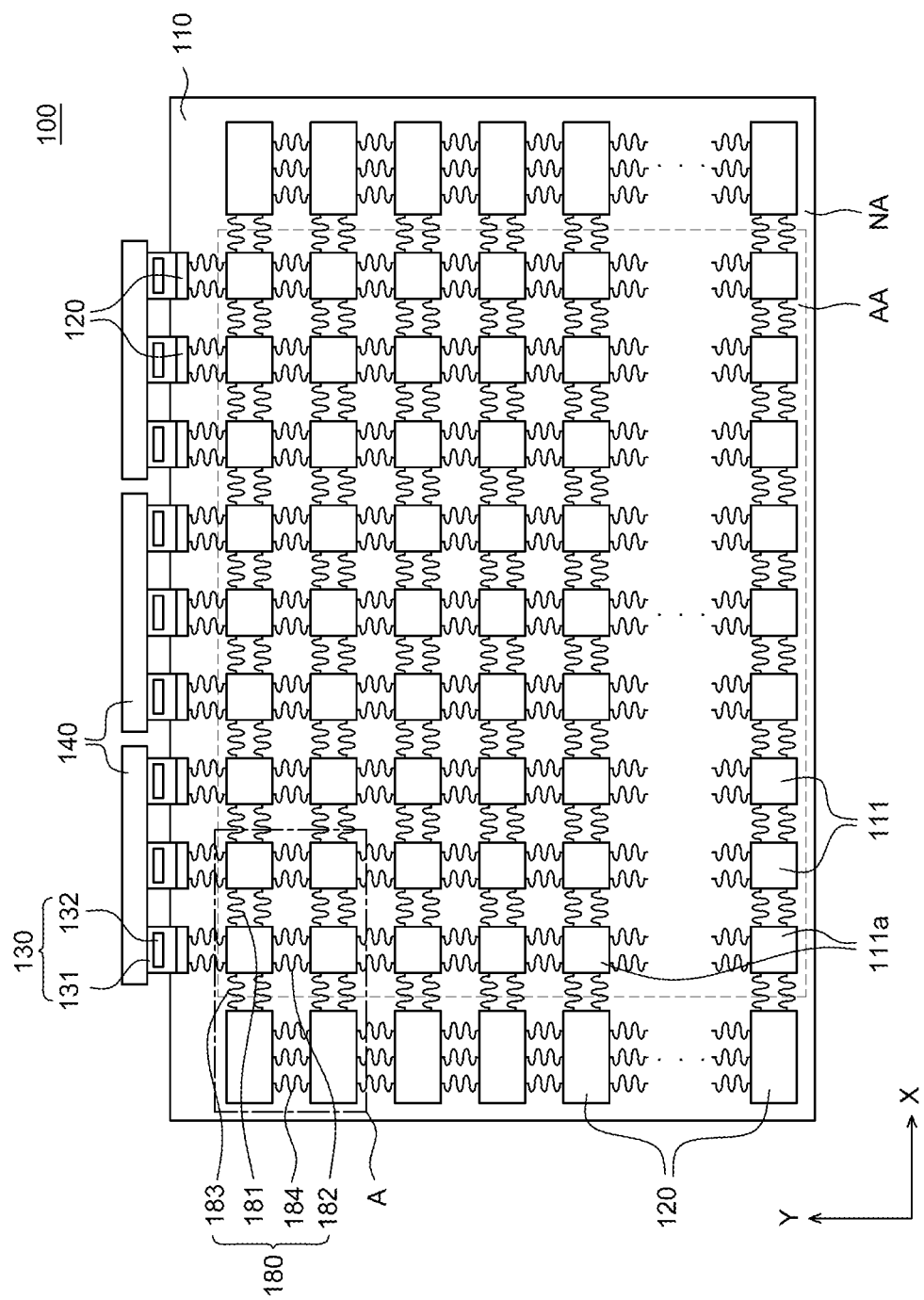
FIG. 1 is a plan view illustrating a stretchable display device according to one or more embodiments of the present disclosure.

Advantages and characteristics of the present disclosure and a method of achieving the advantages and characteristics will be clear by referring to the embodiments described below in detail together with the accompanying drawings. However, the present disclosure is not limited to the embodiments disclosed herein but will be implemented in various forms. The embodiments are provided by way of example only so that those skilled in the art can fully understand the content of the present disclosure and the scope of the present disclosure. Therefore, the present disclosure will be defined only by the scope of the appended claims.

The shapes, sizes, ratios, angles, numbers, and the like illustrated in the accompanying drawings for describing the embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only." Any references to singular may include plural unless expressly stated otherwise.

Components are interpreted to include an ordinary error range even if not expressly stated. For example, unless expressly stated otherwise, the ordinary error range is 5% of the stated value. Relative terms such as "approximately," "substantially," "about" when used in conjunction with a stated amount, value, number, orientation, or other like value refer to an amount, value, number or orientation that is within 5% of the stated amount, value, number, orientation, or other like value, unless the context dictates otherwise.

When the position relation between two parts is described using the terms such as "on," "above," "below," and "next," one or more parts may be positioned between the two parts unless the terms are used with the term "immediately" or "directly."

When an element or layer is disposed "on" another element or layer, another layer or another element may be interposed directly on the other element or therebetween.

Although the terms "first," "second," and the like are used for describing various components, these components are not confined by these terms. These terms are merely used for distinguishing one component from the other components.

Therefore, a first component to be mentioned below may be a second component in a technical concept of the present disclosure.

In one or more embodiments, a size and a thickness of each component illustrated in the drawings is illustrated for convenience of description, and the present disclosure is not limited to the size and the thickness of the component illustrated. In other embodiments, the size and thickness of the components in the drawings are to scale.

The features of various embodiments of the present disclosure can be partially or entirely adhered to or combined with each other and can be interlocked and operated in technically various ways, and the embodiments can be carried out independently of or in association with each other.

Hereinafter, embodiments of the present disclosure will be described in detail with reference to accompanying drawings.

A stretchable display device may refer to a display device which can display images even when it is bent or stretched. The stretchable display device may have higher flexibility than typical display devices. Thus, the stretchable display device can be freely deformed by a user's manipulation such as bending or stretching of the stretchable display device. For example, when the user seizes an end of the stretchable display device and pulls the stretchable display device, the stretchable display device can be stretched by force of the user. If the user places the stretchable display device on an uneven wall surface, the stretchable display device can be bent according to the shape of the wall surface. When the force applied by the user is removed, the stretchable display device can return to its original shape. As such, the stretchable display devices referred to herein are elastically deformable under force applied by a user, whereas known display devices typically exhibit an inelastic or plastic response to force applied by a user.

FIG. 1 is a plan view illustrating a display device according to one or more embodiments of the present disclosure. Referring to FIG. 1, a stretchable display device 100 includes a support substrate 110 (which may be referred to herein as a lower substrate 110), a plurality of first substrates 111, a plurality of second substrates 120, a COF (Chip on Film) 130, and a printed circuit board 140.

The lower substrate 110 serves to protect and support various components disposed in the stretchable display device 100. The lower substrate 110 is a ductile substrate and may be formed of an insulating material which can be bent or stretched. For example, the lower substrate 110 may be formed of silicone rubber such as polydimethylsiloxane (PDMS) and an elastomer such as polyurethane (PU), polytetrafluoroethylene (PTFE). Thus, the lower substrate 110 may have flexibility and exhibit an elastic response to force applied by the user. However, the materials of the lower substrate 110 are not limited thereto.

The lower substrate 110 is a ductile substrate and can be reversibly expanded and contracted. Further, the lower substrate 110 may have an elastic modulus ranging from several MPa to several hundreds of MPa and may have a stretch failure of 100% or more. The thickness of the lower substrate 110 may be from 10 micrometers (μm) to 1 millimeter (mm), but is not limited thereto. For example, in other embodiments, the thickness of the lower substrate 110 may be less than 10 micrometers or more than 1 mm.

The lower substrate 110 includes an active area AA and a non-active area NA surrounding the active area AA. In FIG. 1, the active area AA is indicated with a dashed line, with the non-active area NA extending around an entirety of the active area AA.

The active area AA refers to an area of the stretchable display device 100 in which images are displayed. In the active area AA, a display element and various drive elements for driving the display element are disposed. The active area AA includes a plurality of pixels including a plurality of sub-pixels. The plurality of pixels are disposed in the active area AA and include a plurality of display elements. Each of the plurality of sub-pixels may be connected to various lines. For example, each of the plurality of sub-pixels may be connected to various lines such as a gate line, a data line, a high-potential power line, a low-potential power line, and a reference voltage line.

The non-active area NA refers to an area adjacent to and surrounding the active area AA. The non-active area NA is formed around the active area AA. In the non-active area NA, images are not displayed, and lines and circuits may be disposed. For example, a plurality of pads may be disposed in the non-active area NA, and the pads may be electrically connected to respective ones of the plurality of sub-pixels disposed in the active area AA.

The plurality of first substrates 111 and the plurality of second substrates 120 are disposed on the lower substrate 110. The plurality of first substrates 111 are disposed in the active area AA of the lower substrate 110, and the plurality of second substrates 120 are disposed in the non-active area NA of the lower substrate 110. In or more embodiments, the plurality of second substrates 120 in the non-active area NA are disposed on an upper side, a left side, and a right side of the active area AA, but are not limited thereto. For example, in other embodiments, the plurality of second substrates 120 are disposed on each side of the active area AA and in yet further embodiments, the plurality of second substrates 120 are disposed on only one or two sides of the active area AA. As such, the arrangement of the plurality of second substrates 120 relative to the active area AA can be selected according to design.

The plurality of first substrates 111 and the plurality of second substrates 120 are rigid substrates and are independently spaced apart from each other on the lower substrate 110. In one or more embodiments, the plurality of first substrates 111 are spaced equidistant relative to each other on the lower substrate 110 and the plurality of second substrates 120 are spaced equidistant relative to each other on the lower substrate 110. Moreover, a distance between each of the plurality of second substrates 120 and each of the first plurality of substrates 111 may be the same. The plurality of first substrates 111 and the plurality of second substrates 120 may be more rigid than the lower substrate 110. That is, the lower substrate 110 may be more ductile and flexible than the plurality of first substrates 111 and the plurality of second substrates 120.

The plurality of first substrates 111 and the plurality of second substrates 120 are formed of a plastic material having flexibility, despite preferably being more rigid than the lower substrate 110. The plurality of first substrates 111 and the plurality of second substrates 120 may be formed of, for example, polyimide (PI), polyacrylate, polyacetate, or other like materials. In one or more embodiments, the plurality of first substrates 111 are formed of the same material as the plurality of second substrates 120, but the present disclosure is not limited thereto. For example, the first substrates 111 may also be formed of a different material than the plurality of second substrates 120.

The plurality of first substrates 111 and the plurality of second substrates 120 have a higher modulus of elasticity than the lower substrate 110. The modulus of elasticity refers to an elastic modulus that is the ratio of the stress applied to a substrate to a deformation caused by the stress. If the modulus of elasticity is relatively high, the rigidity may be relatively high, meaning that application of higher stress results in less deflection compared to a material with a lower modulus of elasticity subject to the same stress. Therefore, the plurality of first substrates 111 and the plurality of second substrates 120 may be a plurality of rigid substrates having a higher rigidity than the lower substrate 110. The modulus of elasticity of the plurality of first substrates 111 and the plurality of second substrates 120 may be 1000 times or more than that of the lower substrate 110, but is not limited thereto.

In some embodiments, the lower substrate 110 includes a plurality of first lower patterns and a second lower pattern corresponding to different material compositions of the lower substrate. In other words, the lower substrate 110 includes different types of materials in different sections of the substrate 110. For example, the plurality of first lower patterns are disposed in a region of the lower substrate 110 corresponding to the plurality of first substrates 111 and the plurality of second substrates 120. The second lower pattern is disposed in a region of the lower substrate 110 except the region where the plurality of first substrates 111 and the plurality of second substrates 120 are disposed. In other embodiments, the second lower pattern is disposed in the entirety of the lower substrate 110 of the stretchable display device 100.

In one or more embodiments, the plurality of first lower patterns may have a higher modulus of elasticity than the second lower pattern. For example, the plurality of first lower patterns may be formed of the same material as the plurality of first substrates 111. The second lower pattern may be formed of a material having a lower modulus of elasticity than the plurality of first substrates 111. As such, the material composition of different regions of the lower substrate 110 can be selected to be different in order to reduce stress on the lower substrate 110 by bending or stretching the lower substrate 110. In other words, the material composition of the lower substrate 110 can be selected such that stress is concentrated in more flexible areas (e.g. the second lower pattern) with the more rigid areas (e.g. the first lower pattern) providing support for the plurality of first substrates 111 and the plurality of second substrates 120.

The COF 130 refers to a film including various electrical components, such as integrated circuits, on a ductile base film 131 that is configured to supply signals to the plurality of sub-pixels in the active area AA. The COF 130 may be bonded to the plurality of pads of the plurality of second substrates 120 disposed in the non-active area NA. The COF 130 may supply power voltage, data voltage, gate voltage, etc., through the pads to the respective sub-pixels disposed in the active area AA. The COF 130 may include the base film 131 and a drive integrated circuit (IC) 132 and may further include various components thereon.

The base film 131 supports the drive IC 132 of the COF 130. The base film 131 may be formed of an insulating material. For example, the base film 131 may be formed of an insulating material having flexibility.

The drive IC 132 is configured to process data for displaying an image and a drive signal for processing the data. FIG. 1 illustrates that the drive IC 132 is mounted by a COF method, but is not limited thereto. The drive IC 132 may also be mounted by a Chip On Glass (COG) method or a Tape Carrier Package (TCP) method.

FIG. 1 illustrates that a second substrate 120 is disposed in the non-active area NA on the upper side of the active area AA so as to correspond to first substrates 111 in a column in the active area AA. In other words, each of the second substrates of the plurality of second substrates 120 is aligned with a column or row of aligned first substrates 111. Also, FIG. 1 illustrates that the COF 130 is disposed on the second substrate 120. However, the present disclosure is not limited thereto. That is, a single second substrate 120 and COF 130 may be disposed so as to correspond to first substrates 111 in a plurality of columns or rows.

The printed circuit board 140 includes a controller (which may also be referred to herein as a control unit), such as an IC chip, a circuit, or the like. Further, the printed circuit board 140 may include a memory, a processor, or the like. The printed circuit board 140 is configured to transfer a signal for driving the display elements from the control unit to the display elements. Although FIG. 1 illustrates that the stretchable display device 100 includes three printed circuit boards 140, the number of printed circuit boards 140 is not limited thereto and may more or less than three printed circuit boards 140.

The stretchable display device 100 will be described in more detail with reference to FIG. 2 and FIG. 3.

Figure 2:
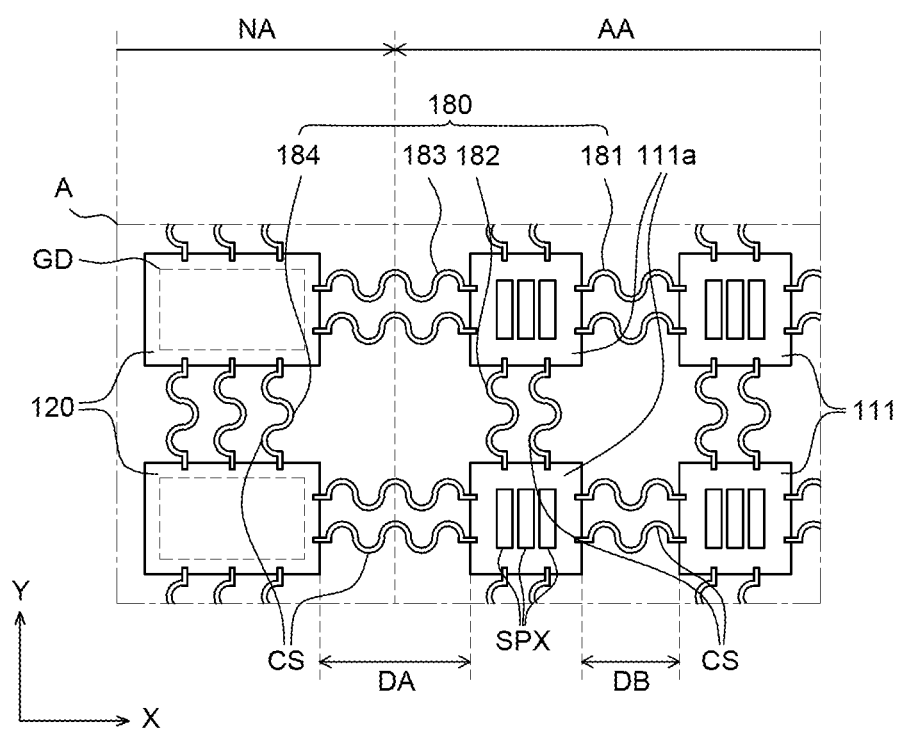
FIG. 2 is an enlarged plan view of an A area of the stretchable display device of FIG. 1.

FIG. 2 is an enlarged plan view of an A area of FIG. 1. FIG. 3 is a schematic cross-sectional view illustrating a sub-pixel SPX of FIG. 2 in additional detail. FIG. 1 will also be referred to for convenience of explanation relative to the larger stretchable display device 100.

Figure 3:
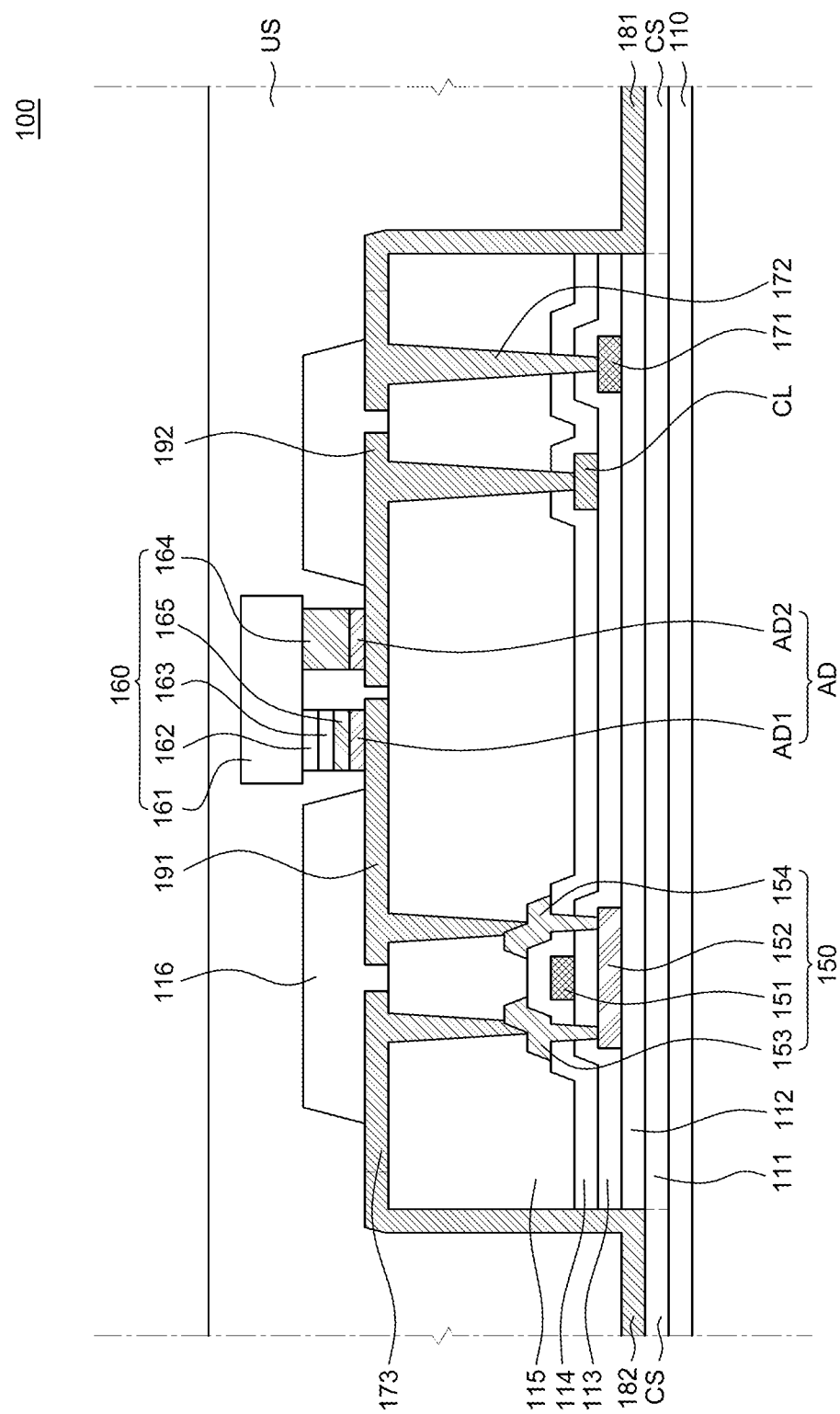
FIG. 3 is a schematic cross-sectional view illustrating a sub-pixel of the stretchable display device of FIG. 2.

Referring to FIG. 2 and FIG. 3, the plurality of first substrates 111 and the plurality of second substrates 120 are disposed on the lower substrate 110. The plurality of first substrates 111 and the plurality of second substrates 120 are disposed and spaced apart from each other on the lower substrate 110. For example, the plurality of first substrates 111 and the plurality of second substrates 120 may be disposed in a matrix form on the lower substrate 110 as shown in FIG. 1 and FIG. 2, but are not limited thereto.

Referring to FIG. 2, a plurality of sub-pixels SPX are disposed in the plurality of first substrates 111. As shown in FIG. 2, each of the plurality of first substrates 111 includes three sub-pixels SPX. However, in other embodiments, there are more or less than three sub-pixels SPX per first substrate 111. Further, gate drivers GD are mounted on second substrates 120 located on the left and right sides of the active area AA. Put another way, the plurality of second substrates 120 located above the active area AA do not include gate drivers GD. The gate drivers GD may be formed on the second substrates 120 by a Gate In Panel (GIP) method when various components on the first substrates 111 are fabricated. Thus, various circuit components, such as various transistors, capacitors, and lines, constituting the gate drivers GD may be disposed on the plurality of second substrates 120. However, the present disclosure is not limited thereto. The gate drivers GD may alternatively be mounted by a COF method, for example.

In one or more embodiments, the stretchable display device 100 includes connection substrates and connection lines disposed on the lower substrate 110 to supply signals to the gate drivers GD on the plurality of second substrates 120 for driving the gate drivers GD. The connection substrates and connection lines connect the plurality of second substrates 120 on the upper side of the active area AA to the plurality of second substrates 120 on the left side and right side of the active area AA. As such, the connection substrates and connection lines may be disposed between the plurality of second substrates 120 on the upper side of the active area AA and the plurality of second substrates 120 on the left and right sides of the active area AA.

Referring to FIG. 2 and FIG. 3, a plurality of connection supports CS (which may be referred to herein as a plurality of third substrates CS or a plurality of flexible interconnects CS) are disposed between the plurality of first substrates 111 and between the plurality of second substrates 120. Further, the plurality of third substrates CS are disposed between the plurality of first substrates 111 and the plurality of second substrates 120. The plurality of third substrates CS connect adjacent first substrates 111 to each other, adjacent second substrates 120 to each other, and the first substrates 111 to adjacent second substrates 120. Thus, the plurality of third substrates CS can also be referred to as connection substrates. The plurality of third substrates CS may be formed of the same material as the first substrates 111 or the second substrates 120. In one or more embodiments, the third substrates CS are formed as one body with the first substrates 111 or the second substrates 120, but are not limited thereto. In other embodiments, the third substrates CS are flexible substrates or films. In yet further embodiments, the third substrates CS are replaced with wires or other conductors.

The plurality of connection supports CS have multiple functions. For example, the connection supports CS connect the first and second substrates 111, 120 and provide support for establishing an electrical connection between the first and second substrates 111, 120 through a conductive layer or wire formed on the connection supports CS, as described herein. Further, the connection supports CS are formed of an elastic material and are structured to stretch, bend, or otherwise deform when force is applied to the stretchable display device 100. As shown in FIGS. 1-3, the connection supports CS have a folded, overlapping configuration similar to a wave shape such that the connection supports CS have a length that is greater than a distance between the first and second substrates 111, 120. In some embodiments, the length of the connection supports CS in a straight line is at least two times, three times, four times, or more than the distance between the first and second substrates 111, 120. As such, when the stretchable display device 100 is deformed, the extra length of material and the composition of the material of the connection supports CS allows the connection supports CS to extend and contract relative to the first and second substrates 111, 120 while maintaining an electrical connection between the first and second substrates 111, 120. While only two connection supports CS are illustrated on each side of the first and second substrates 111, 120 in FIGS. 1-3, it is to be appreciated that embodiments of the present disclosure include more or less than two connection supports CS connected to each side of the first and second substrates 111, 120.

Referring to FIG. 2, the plurality of third substrates CS have a waved or curved shape. For example, as shown in FIG. 2, the plurality of third substrates CS may have a sine wave shape. However, the shape of the plurality of third substrates CS are not limited thereto. For example, the plurality of third substrates CS have a zigzag shape, or the plurality of third substrates CS may have a diamond shape connected to the first and second substrates 111, 120 at vertices of the third substrates CS. Still further, the third substrates CS may have a helical shape. The number and shape of the plurality of third substrates CS shown in FIG. 2 is just an example. The number and shape of the plurality of third substrates CS may be selected according to the design. For example, the third substrates CS may have any shape that allows the third substrates CS to extend and contract relative to the first and second substrates 111, 120.

FIG. 3 shows additional details of one of the plurality of first substrates 111 and a sub-pixel SXP on the first substrate 111. Each of the plurality of first substrates 111 and sub-pixels SXP may have a similar structure to the example shown in FIG. 3. A buffer layer 112 is disposed on the plurality of first substrates 111. The buffer layer 112 is formed on the plurality of first substrates 111 to protect various components of the stretchable display device 100 against permeation of moisture ($H_2O$), oxygen ($O_2$), and the like from the outside of the lower substrate 110 and the plurality of first substrates 111. The buffer layer 112 may be formed of an insulating material. For example, the buffer layer 112 may be formed as one or more inorganic layers of silicon nitride (SiNx), silicon oxide (SiOx), silicon oxynitride (SiON), or the like. However, the buffer layer 112 may be omitted depending on the structure or characteristics of the stretchable display device 100.

In one or more embodiments, the buffer layer 112 may be formed only in a region corresponding to the plurality of first substrates 111 and the plurality of second substrates 120. As described above, the buffer layer 112 may be formed of an inorganic material. Thus, the buffer layer 112 may be easily damaged, such as cracked, while the stretchable display device 100 is stretched. Therefore, the buffer layer 112 may not be formed between the plurality of first substrates 111 and the plurality of second substrates 120, where stress is concentrated during stretching. In other embodiments, the buffer layer 112 is formed of a different material, such as the material of the lower substrate 110, in order to allow stretching or bending of the buffer layer 112 without scratching. The buffer layer 112 may be patterned into the plurality of first substrates 111 and the plurality of second substrates 120 and formed only on the plurality of first substrates 111 and the plurality of second substrates 120. In the stretchable display device 100 according to one or more embodiments of the present disclosure, the buffer layer 112 is formed only in a region overlapping the plurality of first substrates 111 and the plurality of second substrates 120, which are rigid substrates. Thus, it is possible to suppress damage to the buffer layer 112 even when the stretchable display device 100 is deformed, such as bent or stretched, because the first and second substrates 111, 120 provide additional support to the buffer layer 112 during stretching or bending. FIG. 2 further illustrates that the buffer layer 112 is not disposed between connection lines 180 and the plurality of third substrates CS. However, the present disclosure is not limited thereto. The buffer layer 112 may also be disposed between the connection lines 180 and the plurality of third substrates CS.

Referring to FIG. 3, a transistor 150 including a gate electrode 151, an active layer 152, a source electrode 153, and a drain electrode 154 is formed on the buffer layer 112.

Referring to FIG. 3, the active layer 152 is disposed on the buffer layer 112. For example, the active layer 152 may be formed of an oxide semiconductor or may be formed of amorphous silicon (a-Si), polycrystalline silicon (poly-Si), an organic semiconductor, or the like.

A gate insulating layer 113 is disposed on the active layer 152. The gate insulating layer 113 serves as a layer for electrically insulating the gate electrode 151 and the active layer 152 and may be formed of an insulating material. For example, the gate insulating layer 113 may be formed as one or more inorganic layers of silicon nitride (SiNx) or silicon oxide (SiOx), but is not limited thereto.

The gate electrode 151 is disposed on the buffer layer 112. The gate electrode 151 is disposed to overlap the active layer 152. In other words, an outer edge of the gate electrode 151 is spaced inward from an outer edge of the active layer 152 toward a center of the active layer 152. As such, the gate electrode 151 may be aligned with the active layer 152. The gate electrode 151 may be formed of any one of various metal materials, for example, molybdenum (Mo), aluminum (Al), chromium (Cr), gold (Au), titanium (Ti), nickel (Ni), neodymium (Nd), and copper (Cu). Otherwise, the gate electrode 151 may be formed of an alloy of two or more of the above or may be formed as a multi-layer composition of any of the above, but is not limited thereto.

An interlayer insulating layer 114 is disposed on the gate electrode 151. The interlayer insulating layer 114 serves to insulate the gate electrode 151 from the source electrode 153 and the drain electrode 154 and may be formed of an inorganic material like the buffer layer 112. For example, the interlayer insulating layer 114 may be formed as one or more inorganic layers of silicon nitride (SiNx) or silicon oxide (SiOx), but is not limited thereto.

The source electrode 153 and the drain electrode 154 are disposed on the interlayer insulating layer 114 in contact with the active layer 152. As shown in FIG. 3, the source electrode 153 and the drain electrode 154 extend through the interlayer insulating layer 114 and the gate insulating layer 113 to form an electrical connection with the active layer 152. In one or more embodiments, the connection between the source electrode 153, drain electrode 154, and active layer 152 is through contact holes extending through the interlayer insulating layer 114 and the gate insulating layer 113. The source electrode 153 and the drain electrode 154 are disposed and spaced apart from each other on the same layer, namely the interlayer insulating layer 114. The source electrode 153 and the drain electrode 154 are in contact with the active layer 152 and electrically connected to the active layer 152. The source electrode 153 and the drain electrode 154 may be formed of any one of various metal materials, for example, molybdenum (Mo), aluminum (Al), chromium (Cr), gold (Au), titanium (Ti), nickel (Ni), neodymium (Nd), and copper (Cu). In other embodiments, the source electrode 153 and the drain electrode 154 may be formed of an alloy of two or more of the above or may be formed as a multi-layer structure including any of the above materials, but is not limited thereto.

Further, the gate insulating layer 113 and the interlayer insulating layer 114 may be patterned and formed only in a region corresponding to the plurality of first substrates 111. The gate insulating layer 113 and the interlayer insulating layer 114 may also be formed of an inorganic material like the buffer layer 112. Thus, the gate insulating layer 113 and the interlayer insulating layer 114 may be easily damaged in an embodiment, such as cracked, when the stretchable display device 100 is stretched. Therefore, the gate insulating layer 113 and the interlayer insulating layer 114 may not be formed between the plurality of first substrates 111 so as to reduce the likelihood of damage to the gate insulating layer 113 and the interlayer insulating layer 114. The gate insulating layer 113 and the interlayer insulating layer 114 may be patterned into the plurality of first substrates 111 and formed only on the plurality of first substrates 111.

For convenience of explanation, FIG. 3 illustrates only a driving transistor. However, it is to be appreciated that various other transistors can be selected to be included in the stretchable display device 100. For example, a switching transistor, a capacitor, or the like can also be included in the stretchable display device 100. Further, the transistor 150 has been described as having a coplanar structure, but it is to be understood that the transistor 150, as well as other transistors of the stretchable display device 100 can have a different structure, such as a staggered structure or the like.

FIG. 3 further illustrates a gate pad 171 disposed on the buffer layer 112. In some embodiments, the gate pad 171 may be disposed on the gate insulating layer 113. The gate pad 171 transfers gate signals to the plurality of sub-pixels SPX. The gate pad 171 may be formed of the same material as the gate electrode 151, but is not limited thereto.

Referring to FIG. 3, an overcoating layer 115 is formed on the transistor 150 and the interlayer insulating layer 114. The overcoating layer 115 serves to flatten an upper region of the transistor 150 (e.g., a region above the source electrode 153 and the drain electrode 154) and thus may also be referred to herein as a planarizing layer 115. The overcoating layer 115 may be formed as one or more layers of an organic material. For example, the overcoating layer 115 may be formed of an acryl-based organic material, but is not limited thereto.

In some embodiments, a passivation layer may be formed between the transistor 150 and the overcoating layer 115. The passivation layer covers the transistor 150 to protect the transistor 150 against permeation of moisture and oxygen. The passivation layer may be formed of an inorganic material and formed as one or more layers, but is not limited thereto.

Referring to FIG. 3, a bank 116 is formed on a first connection pad 191, a second connection pad 192, a data pad 173, an intermediate pad 172, and the overcoating layer 115. The bank 116 separates adjacent sub-pixels SPX from each other.

The bank 116 is disposed to cover at least a part of the data pad 173 and first connection pad 191 adjacent thereto or at least a part of the intermediate pad 172 and second connection pad 192 adjacent thereto. The bank 116 may be formed of an insulating material. Further, the bank 116 may contain a black material. Since the bank 116 contains a black material, the bank 116 serves to hide lines which can be seen through the active area AA. The bank 116 may be formed of, for example, a transparent carbon-based mixture. Specifically, the bank 116 may contain carbon black, but is not limited thereto. The bank 116 may also be formed of a transparent insulating material.

Referring to FIG. 3, the data pad 173, the intermediate pad 172 and a light-emitting diode (LED) 160 are disposed on the overcoating layer 115.

The data pad 173 transfers data signals to the plurality of sub-pixels SPX from the connection lines 180, which serve as data lines. In FIG. 3, the connection lines 180 include a first connection line 181 and a second connection line 182. The data pad 173 is connected to the source electrode 153 of the transistor 150 through a contact hole formed in the overcoating layer 115. In other embodiments, the data pad 173 is formed on the interlayer insulating layer 114 rather than on the overcoating layer 115. The data pad 173 may also be formed of the same material as the source electrode 153 and the drain electrode 154 of the transistor 150, while in other embodiments, the material of the data pad 173 is different from the source electrode 153 and the drain electrode 154.

The intermediate pad 172 transfers gate signals to the plurality of sub-pixels SPX from the connection lines 180, which serve as gate lines. The intermediate pad 172 is connected to the gate pad 171 through a contact hole formed in the overcoating layer 115, the interlayer insulating layer 114, and the gate insulating layer 113. The intermediate pad 172 transfers gate signals to the gate pad 171. The intermediate pad 172 may be formed of the same material as the data pad 173, but is not limited thereto.

Referring to FIG. 3, a common line CL is disposed on the gate insulating layer 113. The common line CL serves to apply a common voltage to the plurality of sub-pixels SPX. The common line CL may be formed of the same material as the source electrode 153 and the drain electrode 154 of the transistor 150, but is not limited thereto.

The LED 160 is disposed on the first connection line 181 and the second connection line 182. The LED 160 includes an n-type layer 161, an active layer 162, a p-type layer 163, an n-electrode 164, and a p-electrode 165. The LED 160 of the display device 100 according to one or more embodiments of the present disclosure has a flip-chip structure in which the n-electrode 164 and the p-electrode 165 are formed on one surface of the LED 160, as shown in FIG. 3.

The n-type layer 161 may be formed by injecting n-type impurities into gallium nitride (GaN), which has excellent crystallinity. The n-type layer 161 may be disposed on a separate base substrate which is formed of a light-emitting material.

The active layer 162 is disposed on the n-type layer 161. The active layer 162 is a light-emitting layer in the LED 160 and may be formed of a nitride semiconductor, for example, indium gallium nitride (InGaN). The p-type layer 163 is disposed on the active layer 162. The p-type layer 163 may be formed by injecting p-type impurities into gallium nitride (GaN).

The LED 160 according to one or more embodiments of the present disclosure is manufactured by sequentially laminating the n-type layer 161, the active layer 162, and the p-type layer 163, then etching a predetermined region, and forming the n-electrode 164 and the p-electrode 165. In one or more embodiments, the predetermined region is a space to separate the n-electrode 164 and the p-electrode 165 and is etched to expose a portion of the n-type layer 161. In other words, a surface of the LED 160 on which the n-electrode 164 and the p-electrode 165 are to be disposed may not be flat but may have different levels of height along the surface.

The n-electrode 164 is disposed on the etched region, e.g., on the portion of the n-type layer 161 which is exposed by etching. The n-electrode 164 may be formed of a conductive material. Meanwhile, the p-electrode 165 is disposed on the non-etched region, e.g., on the p-type layer 163. The p-electrode 165 may be formed of a conductive material. For example, the p-electrode 165 may be formed of the same material as the n-electrode 164.

The n-electrode 164 and the p-electrode 165 of the LED 160 are electrically connected to the connection lines 180 through an adhesive layer AD. The adhesive layer AD is a conductive adhesive layer and may be formed by dispersing conductive balls in an adhesive material. Therefore, a pressed region where the conductive balls are electrically connected may have conductive properties and a non-pressed region may have insulating properties.

Specifically, the n-electrode 164 is electrically connected to the second connection line 182 through a second adhesive layer AD2, and the p-electrode 165 is electrically connected to the first connection line 181 through a first adhesive layer AD1. However, the present disclosure is not limited thereto. The first connection line 181 may be electrically connected to the n-electrode 164 and the second connection line 182 may be electrically connected to the p-electrode 165. In this case, the first adhesive layer AD1 and the second adhesive layer AD2 may be coated on the first connection pad 191 and the second connection pad 192, respectively, by inkjet or other methods. Then, the LED 160 may be transferred onto the first adhesive layer AD1 and the second adhesive layer AD2. After transfer, the LED 160 is pressed and heated to bond the first connection pad 191 to the p-electrode 165 and the second connection pad 192 to the n-electrode 164. However, the present disclosure is not limited thereto. The adhesive layer AD may be coated as a single layer on the first connection pad 191 and the second connection pad 192.

As such, the display device 100 according to one or more embodiments of the present disclosure has a structure in which the LED 160 is disposed on the lower substrate 110, which also includes the transistor 150. When power is supplied to the display device 100, different levels of voltage are applied to the first connection pad 191 and the second connection pad 192, respectively. The voltages are transferred to the n-electrode 164 and the p-electrode 165 so that the LED 160 can emit light.

Referring to FIG. 2 and FIG. 3, the connection lines 180 refer to lines that electrically connect pads on the plurality of first substrates 111 or the plurality of second substrates 120. The connection lines 180 are disposed on the plurality of third substrates CS. In one or more embodiments, the connection lines 180 have a corresponding shape to the plurality of third substrates CS. In other embodiments, the connection lines have a different shape than the plurality of third substrates CS. The connection lines 180 generally include connection lines 181, 182, 183, 184 described herein.

The connection lines 180 include the first connection line 181, the second connection line 182, a third connection line 183, and a fourth connection line 184 (FIG. 2).

Returning to FIG. 2, the first connection line 181 and the second connection line 182 are disposed between the plurality of first substrates 111. Specifically, the first connection line 181 of the connection lines 180 refers to a line extended in an X-axis direction between the plurality of first substrates 111, as shown in FIG. 2. The second connection line 182 of the connection lines 180 refers to a line extended in a Y-axis direction between the plurality of first substrates 111 as in FIG. 2. The third connection line 183 refers to a line connecting the plurality of first substrates 111 and the plurality of second substrates 120. The fourth connection line 184 refers to a line connecting the plurality of second substrates 120.

In an organic light-emitting display device, various lines such as a plurality of gate lines and a plurality of data lines are extended and disposed between a plurality of sub-pixels. Also, a single signal line is connected to a plurality of sub-pixels. Therefore, in an organic light-emitting display device, various lines such as a gate line, a data line, a high-potential power line, a reference voltage line, etc., are continuously extended on a substrate from one side to the other side of the organic light-emitting display device, in an embodiment.

However, in the stretchable display device 100 according to one or more embodiments of the present disclosure, various lines formed of metal materials, such as a gate line, a data line, a high-potential power line, and a reference voltage line are disposed only on the plurality of first substrates 111 and the plurality of second substrates 120. That is, in the stretchable display device 100 according to one or more embodiments of the present disclosure, various lines formed of metal materials are disposed only on the plurality of first substrates 111 and the plurality of second substrates 120 and are not in contact with the lower substrate 110. Therefore, the various lines may be patterned and discontinuously disposed so as to correspond to the plurality of first substrates 111 and the plurality of second substrates 120.

The connection lines 180 may be formed of a metal material such as copper (Cu), aluminum (Al), titanium (Ti), or molybdenum (Mo). The connection lines 180 may have a metal-laminated structure of copper/molybdenum-titanium (Cu/MoTi) or titanium/aluminum/titanium (Ti/Al/Ti), but are not limited thereto.

In the display device 100 according to one or more embodiments of the present disclosure, pads on the first substrates 111 or the second substrates 120 are connected to the discontinuous lines by the connection lines 180. That is, the connection lines 180 electrically connect pads on two adjacent first substrates 111, two adjacent second substrates 120, or a first substrate 111 and a second substrate 120 adjacent to each other. Therefore, the stretchable display device 100 according to one or more embodiments of the present disclosure include the plurality of connection lines 180 to electrically connect various lines, such as a gate line, a data line, a high-potential power line, and a reference voltage line on the plurality of first substrates 111 and the plurality of second substrates 120. For example, the connection lines may form an electrical connection between the lines on the plurality of first substrates 111, between the lines on the plurality of second substrates 120, and between the lines on the plurality of first substrates 111 and the lines on the plurality of second substrates 120.

For example, a gate line may be disposed on adjacent ones of the plurality of first substrates 111 in the X-axis direction and the gate pads 171 may be disposed on both ends of the gate line. A plurality of gate pads 171 on the plurality of first substrates 111 disposed adjacent to each other in the X-axis direction may be connected to each other by the first connection line 181, which serves as a gate line. Therefore, a gate line disposed on the plurality of first substrates 111 and the first connection line 181 disposed on the third substrate CS may serve as a single, continuous gate line composed of separate parts. Further, all the various lines, such as a data line, a high-potential power line, and a reference voltage line, which can be included in the stretchable display device 100 may serve as a single line of separate, independent components, as described above, via the connection lines 180 and the lines on the first and second substrates 111, 120.

Referring to FIG. 2 and FIG. 3, the first connection line 181 may connect pads on two first substrates 111 disposed parallel to each other of the pads on a plurality of first substrates 111 disposed adjacent to each other in the X-axis direction. The first connection line 181 may serve as a gate line, a light signal line or a low-potential power line, but is not limited thereto. For example, the first connection line 181 may serve as a gate line and electrically connect gate pads 171 on two first substrates 111 disposed parallel to each other in the X-axis direction. Therefore, as described above, the gate pads 171 on the plurality of first substrates 111 disposed in the X-axis direction may be connected by a plurality of first connection lines 181, which serve as a gate line. A gate signal may be transferred to the gate pads 171 via the gate line on the first substrates 111 and the first connection lines 181.

Referring to FIG. 2, the second connection line 182 may connect pads on two first substrates 111 disposed parallel to each other of the pads on a plurality of first substrates 111 disposed adjacent to each other in the Y-axis direction. The second connection line 182 may serve as a data line, a high-potential power line or a reference voltage line, but is not limited thereto. For example, the second connection line 182 may serve as a data line and electrically connect data pads 173 on two first substrates 111 disposed parallel to each other in the Y-axis direction. Therefore, as described above, the data pads 173 on the plurality of first substrates 111 disposed in the Y-axis direction may be connected by a plurality of second connection lines 182, which serve as data lines. A data signal may be transferred to the data pads 173 by the data line on the first substrates 111 and the second connection lines 182.

Referring to FIG. 2, the third connection line 183 may connect pads on the plurality of first substrates 111 and the plurality of second substrates 120 disposed adjacent to each other. Specifically, the third connection line 183 may connect pads on first substrates 111a disposed in an outermost region of the active area AA and corresponding second substrates 120 disposed parallel to each other of the pads on a plurality of outermost first substrates 111a disposed in the active area AA and the plurality of second substrates 120. The third connection line 183 may serve as a gate line or a low-potential power line, but is not limited thereto. For example, the third connection line 183 may serve as a gate line and electrically connect pads on an outermost first substrate 111a and a second substrate 120 disposed parallel to each other.

Referring to FIG. 2, the fourth connection line 184 may connect pads on two second substrates 120 disposed parallel to each other of the pads on a plurality of second substrates 120 disposed adjacent to each other in the Y-axis direction. The fourth connection line 184 may serve as one of various signal lines for driving the gate drivers GD, a clock line, a high-potential power line, or a low-potential power line, but is not limited thereto. The function of the fourth connection line 184 can be selected according to design.

The first connection line 181 is in contact with side surfaces of the overcoating layer 115, interlayer insulating layer 114 and buffer layer 112 disposed on the first substrate 111 and may extend to contact an upper surface of the third substrate CS. Therefore, in one or more embodiments, the first connection line 181 is in contact with the upper surface of the third substrate CS. Also, the first connection line 181 may be in contact with side surfaces of the buffer layer 112, gate insulating layer 113, interlayer insulating layer 114 and overcoating layer 115 and disposed on the first substrate 111 adjacent thereto. Further, the first connection line 181 and the intermediate pad 172 may be formed as one continuous body disposed on the first substrate 111, but is not limited thereto. For example, the dashed lines between the intermediate pad 172 and the first connection line 181 indicate that the first connection line 181 and the intermediate pad 172 may also be formed as separate components that are connected to each other at the location of the dashed line.

Referring to FIG. 2, the second connection line 182 is in contact with side surfaces of the overcoating layer 115, interlayer insulating layer 114 and buffer layer 112 disposed on the first substrate 111 and may extend to the upper surface of the third substrate CS. Therefore, in one or more embodiments, the second connection line 182 is in contact with the upper surface of the third substrate CS. Also, the second connection line 182 may be in contact with side surfaces of the buffer layer 112, data insulating layer 113, interlayer insulating layer 114 and overcoating layer 115 and disposed on the first substrate 111 adjacent thereto. Further, the second connection line 182 may be in contact with and disposed adjacent to the data pad 173 on the first substrate 111, but is not limited thereto. In one or more embodiments, the second connection line 182 and the data pad 173 can be formed as single, continuous body. However, in other embodiments, the second connection line 182 and the data pad 173 are separate components coupled to each other at the location of the dashed line.

Referring to FIG. 3, an upper substrate US is disposed on the bank 116, the LED 160, and the lower substrate 110.

The upper substrate US supports various components disposed under the upper substrate US. Specifically, the upper substrate US may be formed by coating and hardening a material on the lower substrate 110 and the first substrate 111. Further, in one or more embodiments, the upper substrate US is disposed in contact with the lower substrate 110, the first substrate 111, the third substrate CS, and the connection lines 180, including both the first and second connection lines 181, 182.

The upper substrate US is a ductile substrate and may be formed of an insulating material which can be bent or stretched. The upper substrate US is a ductile substrate and can be reversibly expanded and contracted and thus exhibits elastic properties. Further, the upper substrate US may have an elastic modulus ranging from several MPa to several hundreds of MPa and may have a stretch failure of 100% or more. The thickness of the upper substrate US may be from 10 μm to 1 mm, but is not limited thereto. For example, in other embodiments, the upper substrate US has a thickness less than 10 micrometers or more than 1 mm.

In one or more embodiments, the upper substrate US is formed of the same material as the lower substrate 110. For example, the upper substrate US may be formed of silicone rubber such as polydimethylsiloxane (PDMS) and an elastomer such as polyurethane (PU), and polytetrafluoroethylene (PTFE). Thus, the upper substrate US may have flexibility. However, the materials of the upper substrate US are not limited thereto and other flexible and ductile materials are expressly contemplated herein.

A polarizing layer may also be disposed on the upper substrate US. The polarizing layer polarizes light incident from the outside of the stretchable display device 100 and suppresses reflection of external light.

Referring to FIG. 2, the plurality of second substrates 120 have a size that is larger than a size of the plurality of first substrates 111, in one or more embodiments. Specifically, each of the plurality of second substrates 120 may be larger than each of the plurality of first substrates 111. As described above, the gate drivers GD may be disposed on the plurality of second substrates 120, respectively. For example, a single stage of the gate driver GD may be disposed on each of the plurality of second substrates 120. Because the size of various circuit components constituting a single stage of the gate driver GD may be larger than the sub-pixels SPX disposed on the first substrate 111, a size of the second substrates 120 is preferably larger than a size of the first substrates 111. For example, a surface area of the second substrates 120 may be larger than a surface area of the first substrates 111. However, in other embodiments, the first and second substrates 111, 120 are the same size, while in yet further embodiments, the second substrates 120 are smaller than the first substrates 111.

Referring to FIG. 2, a distance DA between the plurality of outermost first substrates 111a disposed in the outermost region of the active area AA and the plurality of second substrates 120 is greater than a distance DB between the plurality of first substrates 111 in the active area AA. Specifically, the plurality of outermost first substrates 111a and the plurality of second substrates 120 may be disposed at the larger distance DA from each other than the distance DB between the plurality of first substrates 111.

In one or more embodiments, the plurality of second substrates 120 are formed larger than the plurality of first substrates 111. Due to a difference in size between the plurality of second substrates and the plurality of first substrates, the plurality of second substrates 120 contract less than the first substrates 111 according to Poisson's ratio, e.g., in a Y-axis direction, when the stretchable display device 100 is stretched. Therefore, overstretching can occur at the edges of the plurality of second substrates 120 and parts of third connection lines 183 connected to the plurality of second substrates. Accordingly, stress may be concentrated on the plurality of second substrates 120 and the third connection lines 183. Thus, the plurality of second substrates and the third connection lines may be susceptible to damage.

In the stretchable display device 100 according to one or more embodiments of the present disclosure, the plurality of outermost first substrates 111a and the plurality of second substrates 120 are disposed at a larger distance DA than the distance DB between the plurality of first substrates 111. Thus, when the stretchable display device 100 is stretched, stress concentrated on the plurality of second substrates 120 and the third connection line 183 is reduced because of the increase in area corresponding to the distance DA. The plurality of second substrates 120 are larger than the plurality of first substrates 111. Thus, when the stretchable display device 100 is stretched, stress may be concentrated on the third connection line 183 disposed between the plurality of outermost first substrates 111a and the plurality of second substrates 120.

In one or more embodiments, the distance DA between the plurality of outermost first substrates 111a and the plurality of second substrates 120 is larger than the distance DB between the plurality of first substrates 111. Thus, the size of a region where stress is generated can be increased, which reduces the stress throughout that area due to the increase in cross-sectional area of the region corresponding to the distance DA between the outermost first substrates 111a and the second substrates 120. For example, the distance DA between the plurality of outermost first substrates 111a and the plurality of second substrates 120 may be two times greater than the distance DB between the plurality of first substrates 111. The length of the third connection line 183 disposed between the plurality of second substrates 120 and the plurality of outermost first substrates 111a of the plurality of first substrates 111 can correspondingly be doubled relative to a length of the first connection lines 181. Therefore, the amount of stress on the third connection line 183 per unit area can be reduced by one half. When the stretchable display device 100 according to one or more embodiments of the present disclosure is stretched, stress concentrated on the plurality of second substrates 120 and the third connection line 183 is therefore reduced relative to an embodiment where the second substrates 120 are spaced from the outermost first substrates 111a by the distance DB. Therefore, the likelihood of damage to the plurality of second substrates 120 and the third connection line 183 can be reduced, which improves reliability of the stretchable display device 100.

Figure 4:
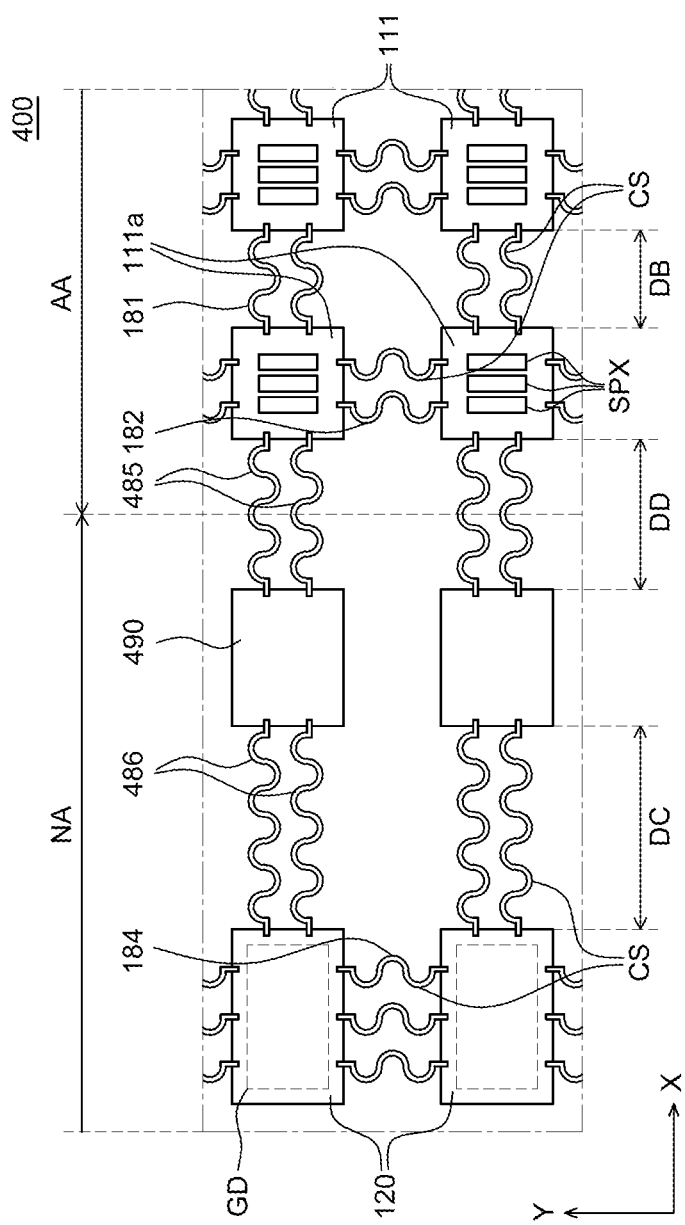
FIG. 4 is an enlarged plan view illustrating a portion of a stretchable display device according to one or more embodiments of the present disclosure.

FIG. 4 is an enlarged plan view illustrating a stretchable display device 400 according to another exemplary embodiment of the present disclosure. The stretchable display device 400 shown in FIG. 4 is substantially the same in some respects as the stretchable display device 100 shown in FIG. 1 through FIG. 3 except for a plurality of fourth substrates 490 and a plurality of connection lines 480. Therefore, redundant description of similar components will be omitted. The plurality of connection lines 480 generally include connection lines 181, 182, 184, 485, 486 described herein.

Referring to FIG. 4, the stretchable display device 400 includes the plurality of fourth substrates 490. The plurality of fourth substrates 490 may be formed of the same material as the plurality of first substrates 111 or the plurality of second substrates 120, but are not limited thereto.

Lines may be disposed in the plurality of fourth substrates 490. Specifically, lines for transferring signals to the subpixels SPX from the gate drivers GD may be disposed in the plurality of fourth substrates 490. However, the present disclosure is not limited thereto. For example, dummy pixels may also be disposed in or on the plurality of fourth substrates 490.

Referring to FIG. 4, the plurality of fourth substrates 490 are disposed between the plurality of outermost first substrates 111a and the plurality of second substrates 120. Specifically, one of the plurality of fourth substrates 490 may be disposed between one of the plurality of outermost first substrates 111a and a corresponding one of the plurality of second substrates 120 aligned with the one of the plurality of outermost first substrates 111a. In one or more embodiments, the plurality of fourth substrates 490 are larger than the plurality of outermost first substrates 111a and smaller than the plurality of second substrates 120, but the present disclosure is not limited thereto. The plurality of fourth substrates 490 may be equal in size to the plurality of outermost first substrates 111a and smaller than the plurality of second substrates 120. In further embodiments, the plurality of fourth substrates 490 may be larger than the plurality of outermost first substrates 111a and equal in size to the plurality of second substrates 120.

Referring to FIG. 4, the plurality of fourth substrates 490 are connected to the plurality of outermost first substrates 111a by a fifth connection line 485 and to the plurality of second substrates 120 by a sixth connection line 486. The fifth connection line 485 and the sixth connection line 486 may serve as gate lines, light signal lines or low-potential power lines, but are not limited thereto. For example, the fifth connection line 485 and the sixth connection line 486 may serve as gate lines. Also, the fifth connection line 485 and the sixth connection line 486 may electrically connect the plurality of fourth substrates 490 to the plurality of outermost first substrates 111a and the plurality of fourth substrates 490 to the plurality of second substrates 120, respectively.

Referring to FIG. 4, a distance DD between the plurality of outermost first substrates 111a and the plurality of fourth substrates 490 may be greater than the distance DB between the plurality of first substrates 111. Also, a distance DC between the plurality of fourth substrates 490 and the plurality of second substrates 120 may be greater than the distance DD between the plurality of outermost first substrates 111a and the plurality of fourth substrates 490. That is, a distance between substrates may gradually increase from the plurality of first substrates 111 toward the plurality of second substrates 120.

In the stretchable display device 400 according to one or more embodiments of the present disclosure, the plurality of fourth substrates 490 are disposed between the plurality of outermost first substrates 111a and the plurality of second substrates 120. When the stretchable display device 400 is stretched, stress concentrated on the plurality of second substrates 120 and the sixth connection line 486 can be reduced. Specifically, the plurality of fourth substrates 490 are formed larger than the plurality of outermost first substrates 111a and smaller than the plurality of second substrates 120. Further, the plurality of fourth substrates 490 are disposed between the plurality of outermost first substrates 111a and the plurality of second substrates 120. As such, when the stretchable display device 400 is stretched, stress concentrated on the sixth connection line 486 connected to the plurality of second substrates 120 is dispersed to the fifth connection line 485. Thus, damage to the plurality of second substrates 120 and the sixth connection line 486 can be reduced by distributing some of the stress that would normally be applied to the sixth connection line 486 to the fifth connection line 485.

Further, in the stretchable display device 400 according to one or more embodiments of the present disclosure, the distance DD between the plurality of outermost first substrates 111a and the plurality of fourth substrates 490 is greater than the distance DB between the plurality of first substrates 111. Also, the distance DC between the plurality of fourth substrates 490 and the plurality of second substrates 120 is greater than the distance DD between the plurality of outermost first substrates 111a and the plurality of fourth substrates 490. Thus, stress concentrated on the plurality of second substrates 120 and the sixth connection line 486 can be reduced by increasing the area between the substrates 120, 490, 111. When the stretchable display device 400 is stretched, stress concentrated on the fifth connection line 485 disposed between the plurality of fourth substrates 490 and the plurality of outermost first substrates 111a can be reduced due to the increased area between the fourth substrates 490 and the outermost first substrates 111a relative to the area between the first substrates 111 (corresponding to distance DB). Likewise, the distance DC between the plurality of fourth substrates 490 and the plurality of second substrates 120 is greater than the distance DD between the plurality of fourth substrates 490 and the plurality of outermost first substrates 111a. As such, stress concentrated on the plurality of second substrates 120 and the sixth connection line 486 is reduced.

Figure 5:
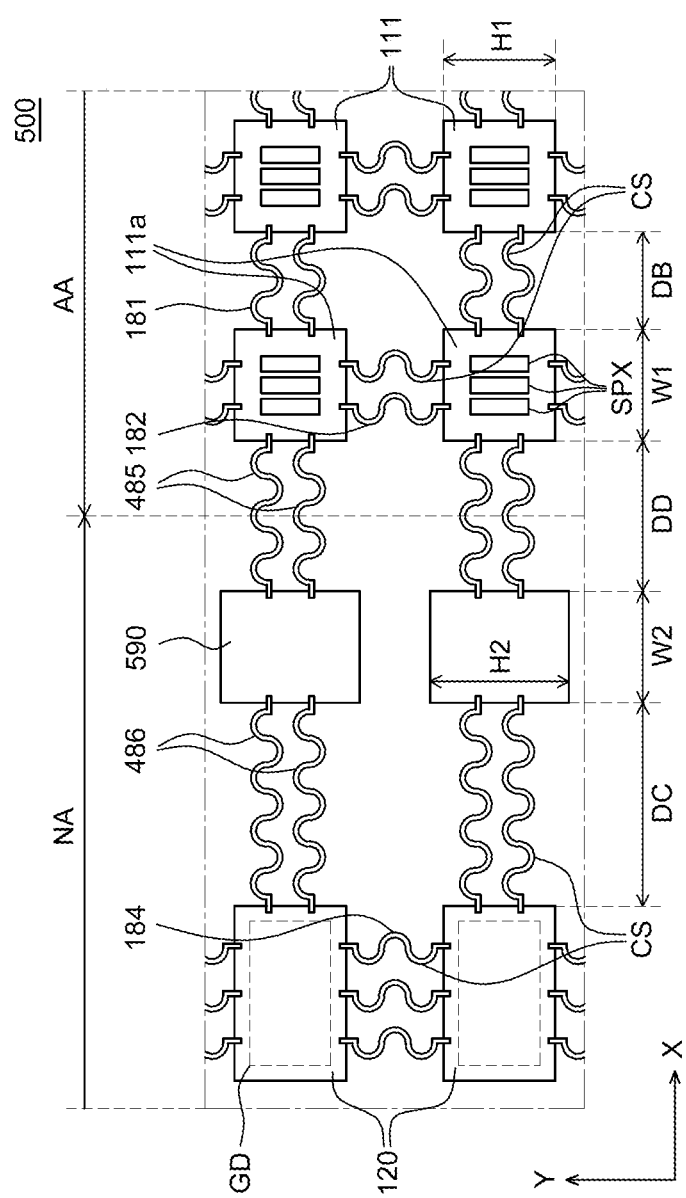
FIG. 5 is an enlarged plan view illustrating a portion of a stretchable display device according to one or more embodiments of the present disclosure.

FIG. 5 is an enlarged plan view illustrating a stretchable display device 500 according to one or more embodiments of the present disclosure. The stretchable display device 500 shown in FIG. 5 is substantially the same in some respects as the stretchable display device 400 shown in FIG. 4, except for a plurality of fourth substrates 590. Therefore, redundant description of similar components will be omitted.

Referring to FIG. 5, the plurality of fourth substrates 590 are smaller than the plurality of second substrates 120 and larger than the plurality of first substrates 111. In one or more embodiments, a width W2 of the plurality of fourth substrates 590 in the X-axis direction is equal to a width W1 of the plurality of first substrates 111 in the X-axis direction. However, a height H2 of a fourth substrate 590 in the Y-axis direction may be larger than a height H1 of the plurality of first substrates 111 in the Y-axis direction. As such, the plurality of fourth substrates 590 may be larger in size than the plurality of first substrates 111.

In the stretchable display device 500 according to one or more embodiments of the present disclosure, the height of the plurality of fourth substrates 590 increases in the Y-axis direction relative to the height of the first substrates 111 while maintaining the same width as the first substrates 111. Thus, the non-active area NA of the stretchable display device 500 can be reduced.

If the plurality of fourth substrates 590 are disposed between the plurality of outermost first substrates 111a and the plurality of second substrates 120, the size or width of the non-active area NA of the stretchable display device 500 may increase. If the non-active area NA increases, a bezel area of the stretchable display device 500 may increase. Therefore, in the stretchable display device 500 according to one or more embodiments of the present disclosure, the width W2 of the plurality of fourth substrates 590 in the X-axis direction is equal to the width W1 of the plurality of first substrates 111 in the X-axis direction. However, the height H2 of the fourth substrate 590 in the Y-axis direction is greater than the height H1 of the plurality of first substrates 111 in the Y-axis direction. Therefore, it is possible to reduce the size of the non-active area NA to counteract the increase in size of the non-active area NA in embodiments including the plurality of fourth substrates 590. Accordingly, it is possible to reduce the bezel area of the stretchable display device 500 while also including additional substrates (e.g., fourth substrates 490) between the first and second substrates 111, 120.

In some embodiments, the width W2 of the plurality of fourth substrates 590 in the X-axis direction is less than the width W1 of the plurality of first substrates 111 in the X-axis direction to further reduce the bezel area of the stretchable display device 500.

Figure 6:
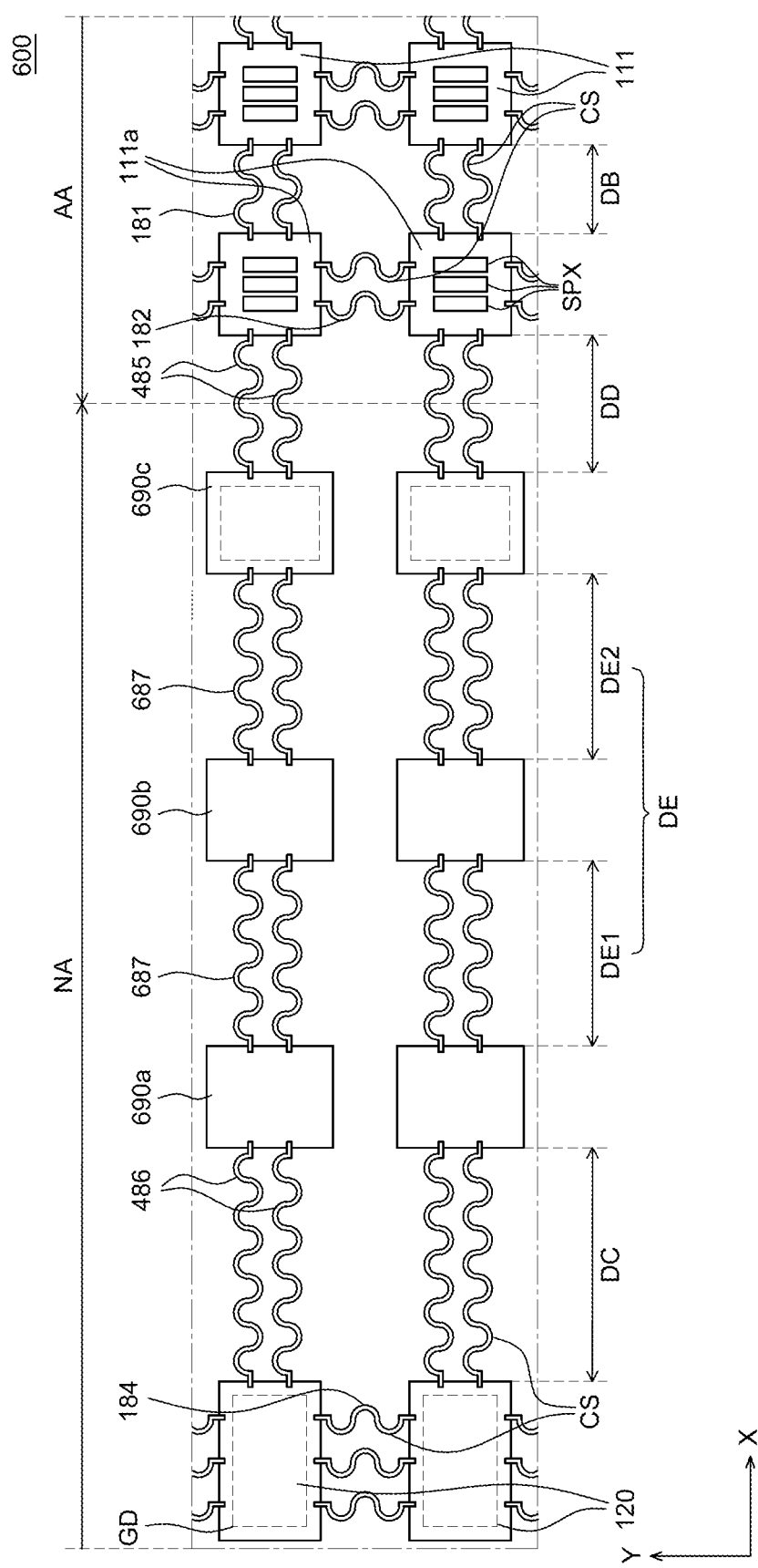
FIG. 6 is an enlarged plan view illustrating a portion of a stretchable display device according to one or more embodiments of the present disclosure.

FIG. 6 is an enlarged plan view illustrating a stretchable display device 600 according to one or more embodiments of the present disclosure. The stretchable display device 600 shown in FIG. 6 is substantially the same in some respects as the stretchable display device 400 shown in FIG. 4, except for a plurality of fourth substrates 690 and a plurality of connection lines 680. Therefore, redundant description of similar components will be omitted. The connection lines 680 generally include connection lines 181, 182, 184, 485, 486, 687 described herein. The plurality of fourth substrates 690 generally include fourth substrates 690a, 690b, 690c described below.

Referring to FIG. 6, the plurality of fourth substrates 690, which includes fourth substrates 690a, 690b, and 690c arranged in series, are disposed between the plurality of outermost first substrates 111a and the plurality of second substrates 120. Specifically, the plurality of fourth substrates 690 are disposed between one of the plurality of outermost first substrates 111a and one of the plurality of second substrates 120. FIG. 6 illustrates that three fourth substrates 690 are disposed between one of the plurality of outermost first substrates 111a and one of the plurality of second substrates 120, but the present disclosure is not limited thereto. Rather, the fourth substrates 690 may include more or less than three substrates 690 between the outermost first substrates 111a and a corresponding second substrate 120 in other embodiments.

Referring to FIG. 6, the plurality of fourth substrates 690 are smaller than the plurality of second substrates 120 and larger than the plurality of first substrates 111. However, the present disclosure is not limited thereto. The plurality of fourth substrates 690 may be equal in size to the plurality of outermost first substrates 111a and smaller than the plurality of second substrates 120. In yet further embodiments, the plurality of fourth substrates 690 may be larger than the plurality of outermost first substrates 111a and equal in size to the plurality of second substrates 120.

Referring to FIG. 6, the plurality of fourth substrates 690 may be connected to each other by a seventh connection line 687. Specifically, the seventh connection line 687 may connect the plurality of fourth substrates 690 disposed adjacent to each other in the X-axis direction. As shown in FIG. 6, the plurality of fourth substrates 690 are not connected to each other by a connection line in the y-axis direction, in one or more embodiments. In other embodiments, the plurality of fourth substrates 690 include seventh connection lines 687 between the fourth substrates 690. The seventh connection line 687 may serve as a gate line, a light signal line or a low-potential power line, but is not limited thereto. For example, the seventh connection line 687 may serve as a gate line and electrically connect the plurality of fourth substrates 690 to each other, respectively.

Referring to FIG. 6, a fourth substrate 690a is the closest to the plurality of second substrates 120 of the plurality of fourth substrates 690. A fourth substrate 690c is the closest to the plurality of outermost first substrates 111a of the plurality of fourth substrates 690 and a fourth substrate 690b is between the fourth substrates 690a, 690c. A distance DC between the fourth substrate 690a and the plurality of second substrates 120 is greater than a distance DD between the fourth substrate 690c and the plurality of outermost first substrates 111a.

Referring to FIG. 6, a distance DE between the plurality of fourth substrates 690 may be uniform for each set of fourth substrates 690a, 690b, 690c. A distance DE1 is a distance between the fourth substrate 690a closest to the plurality of second substrates 120 and the fourth substrate 690b in the middle of the plurality of fourth substrates 690. A distance DE2 is a distance between the fourth substrate 690c closest to the plurality of outermost first substrates 111a and the fourth substrate 690b in the middle of the plurality of fourth substrates 690. The distance DE1 may be equal to the distance DE2, but is not limited thereto. For example, the distance DE1 between the fourth substrate 690a and the fourth substrate 690b may be greater than the distance DE2 between the fourth substrate 690c and the fourth substrate 690b. As such, the distance between the plurality of fourth substrates 690 may gradually increase from the plurality of first substrates 111 toward the plurality of second substrates 120, or the distances DE1 and DE2 may be the same. In one or more embodiments, the distance D1 is less than the distance D2 and as such, the distance between the plurality of fourth substrates 690 may gradually decrease from the plurality of first substrates 111 toward the plurality of second substrates 120.

In the stretchable display device 600 according to one or more embodiments of the present disclosure, the plurality of fourth substrates 690 are disposed between the plurality of outermost first substrates 111a and the plurality of second substrates 120. Thus, when the stretchable display device 600 is stretched, stress concentrated on the plurality of second substrates 120 and the sixth connection line 486 can be reduced. The plurality of fourth substrates 690 are larger than the plurality of outermost first substrates 111a and smaller than the plurality of second substrates 120. Further, the plurality of fourth substrates 690 are disposed between the plurality of outermost first substrates 111a and the plurality of second substrates 120. As such, when the stretchable display device 600 is stretched, stress concentrated on the sixth connection line 486 connected to the plurality of second substrates 120 having the largest size is dispersed to the plurality of fourth substrates 690, the seventh connection line 687, and the fifth connection line 485. Thus, the likelihood of damage to the plurality of second substrates 120 and the sixth connection line 486 can be reduced.

Figure 7:
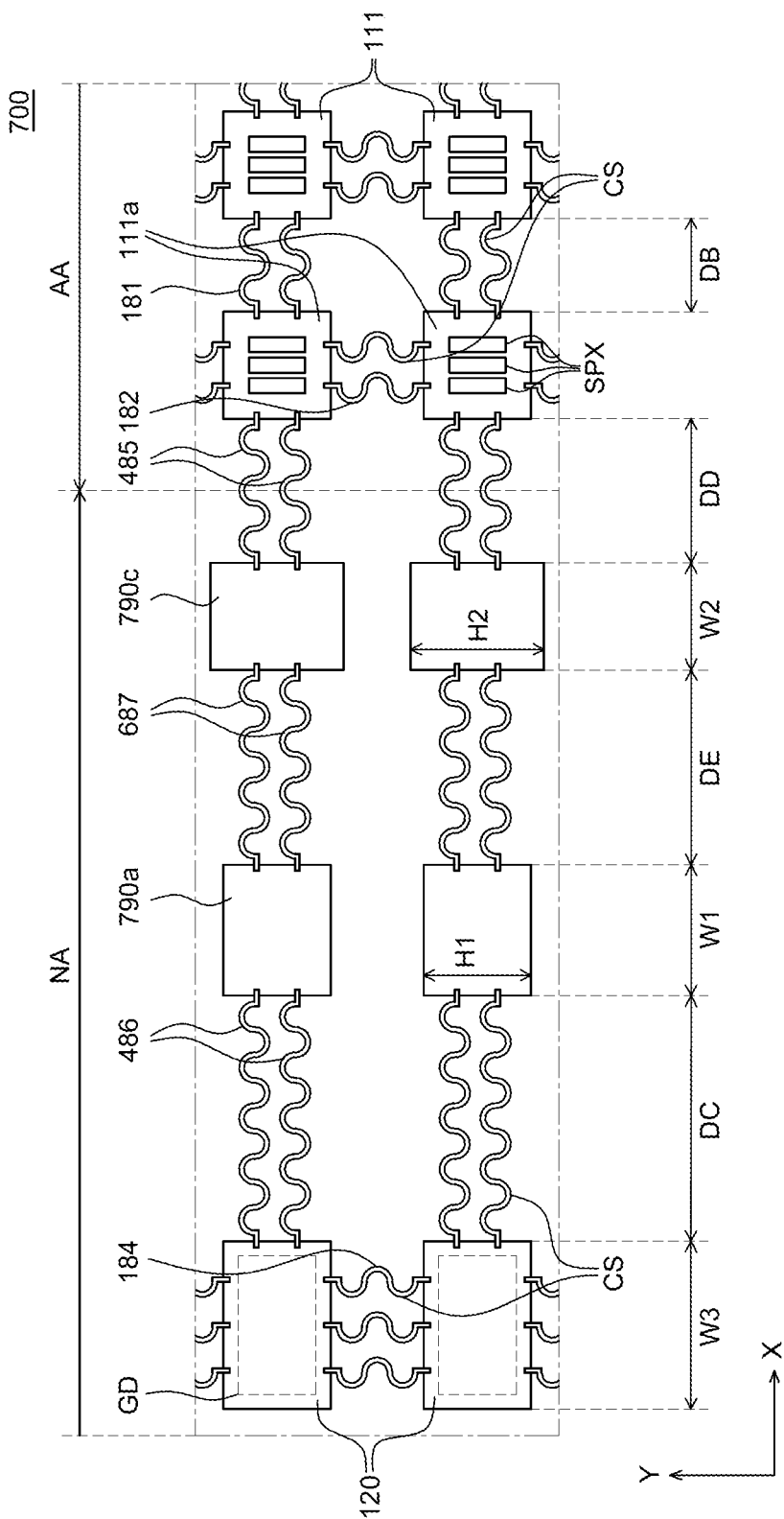
FIG. 7 is an enlarged plan view illustrating a portion of a stretchable display device according to one or more embodiments of the present disclosure.

FIG. 7 is an enlarged plan view illustrating a stretchable display device 700 according to one or more embodiments of the present disclosure. The stretchable display device 700 shown in FIG. 7 is substantially the same in some respects as the stretchable display device 600 shown in FIG. 6, except for a plurality of fourth substrates 790. Therefore, redundant description of similar components will be omitted. The plurality of fourth substrates 790 generally include fourth substrates 790*a* and 790*c* described herein.

Referring to FIG. 7, the plurality of fourth substrates 790 are disposed between the plurality of outermost first substrates 111*a* and the plurality of second substrates 120. Specifically, the plurality of fourth substrates 790 are disposed between one of the plurality of outermost first substrates 111*a* and a corresponding one of the plurality of second substrates 120. FIG. 7 illustrates that two fourth substrates 790 are disposed between one of the plurality of outermost first substrates 111*a* and one of the plurality of second substrates 120, but the present disclosure is not limited thereto.

Referring to FIG. 7, the plurality of fourth substrates 790 are smaller than the plurality of second substrates 120 and larger than the plurality of first substrates 111. However, the present disclosure is not limited thereto. The plurality of fourth substrates 790 may be equal in size to the plurality of outermost first substrates 111*a* and smaller than the plurality of second substrates 120. The plurality of fourth substrates 790 may also be larger than the plurality of outermost first substrates 111*a* and equal to the plurality of second substrates 120.

The plurality of fourth substrates 790 may increase in size towards the plurality of second substrates 120. A fourth substrate 790*a* is the closest to the plurality of second substrates 120 of the plurality of fourth substrates 790 and a fourth substrate 790*c* is the closest to the plurality of outermost first substrates 111*a* of the plurality of fourth substrates 790. The fourth substrate 790*a* may be larger than the fourth substrate 790*c*. For example, the fourth substrate 790*a* has a width W1 in the x-direction that is greater than a width W2 of the fourth substrates 790*c* in the x-direction. A width W3 of the second substrates 120 may be greater than the width W2 or W1. The width of the first substrates 111 is the same as the width W2 of the fourth substrate 790*c* in one or more embodiments. Thus, the substrates disposed in the stretchable display device 700 may sequentially decrease in size, and more particularly, width, from the plurality of second substrates 120 to the plurality of first substrates 111. However, the present disclosure is not limited thereto. The plurality of fourth substrates 790 may be equal in size to each other.

A height H2 of the fourth substrate 790*c* may be greater than a height H1 of the fourth substrate 790*a*, which is the same as the height of the first substrates 111 and the second substrates 120. As such, each of the substrates 120, 790, and 111 may have the same height, except for the fourth substrate 790*c*, which has a height greater than the remaining substrates 120, 790, 111.

In the stretchable display device 700 according to one or more embodiments of the present disclosure, the plurality of fourth substrates 790 disposed between the plurality of outermost first substrates 111*a* and the plurality of second substrates 120 increase in size towards the plurality of second substrates 120. Thus, when the stretchable display device 700 is stretched, stress concentrated on the plurality of second substrates 120 and the sixth connection line 486 can be reduced. Specifically, the plurality of fourth substrates 790 are larger than the plurality of outermost first substrates 111*a* and smaller than the plurality of second substrates 120 and disposed between the plurality of outermost first substrates 111*a* and the plurality of second substrates 120. As such, when the stretchable display device 700 is stretched, stress concentrated on the sixth connection line 486 connected to the plurality of second substrates 120 having the largest size is dispersed to the plurality of fourth substrates 790, the seventh connection line 687, and the fifth connection line 485. Thus, the likelihood of damage to the plurality of second substrates 120 and the sixth connection line 486 can be reduced.

Figure 8:
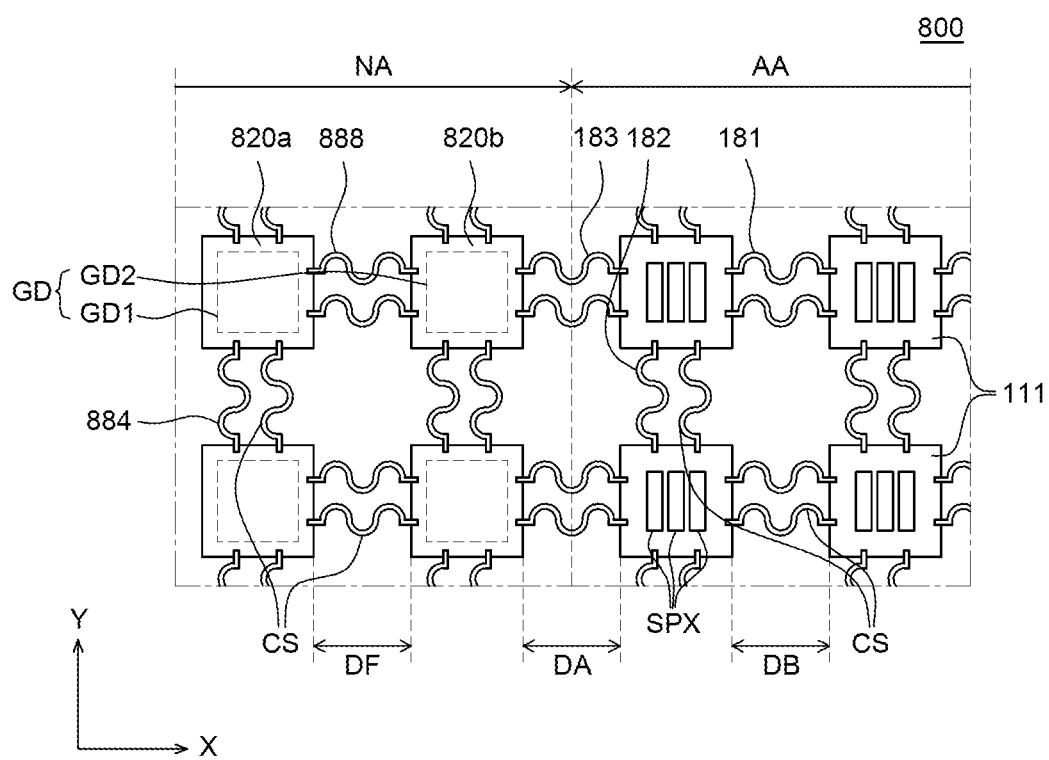
FIG. 8 is an enlarged plan view illustrating a portion of a stretchable display device according to one or more embodiments of the present disclosure.

FIG. 8 is an enlarged plan view illustrating a stretchable display device 800 according to one or more embodiments of the present disclosure. The stretchable display device 800 shown in FIG. 8 is substantially the same in some respects as the stretchable display device 100 shown in FIG. 1 through FIG. 3, except for a plurality of second substrates 820 and a plurality of connection lines 880. Therefore, redundant description of similar components will be omitted. The plurality of fourth substrates 820 generally include fourth substrates 820*a*, 820*b* described herein. The plurality of connection lines 880 generally include connection lines 181, 182, 183, 884, 888 described herein.

Referring to FIG. 8, each gate driver GD includes a first gate driver GD1 and a second gate driver GD2. The first gate driver GD1 and the second gate driver GD2 may constitute a single stage of a gate driver GD, in one or more embodiments. That is, various circuit components constituting a single stage may be distributed and disposed in the first gate driver GD1 and the second gate driver GD2.

Each of the plurality of second substrates 820 includes a plurality of substrate portions 820*a* and 820*b* (which may be referred to herein as a plurality of sub-substrates 820*a* and 820*b*). The gate driver GD may be mounted on each of the plurality of sub-substrates 820*a* and 820*b*. For example, the first gate driver GD1 is mounted on the sub-substrate 820*a* disposed in the outermost region of the non-active area NA. The second gate driver GD2 is mounted on the sub-substrate 820*b* closest to the plurality of outermost first substrates 111*a*.

The plurality of sub-substrates 820*a* and 820*b* may be formed equal in size to each other. Herein, each of the plurality of sub-substrates 820*a* and 820*b* may be equal in size to the plurality of first substrates 111. Further, FIG. 8 illustrates that the plurality of second substrates 820 includes the two sub-substrates 820*a* and 820*b*. However, the present disclosure is not limited thereto.

Referring to FIG. 8, a distance DF between the plurality of sub-substrates 820*a* and 820*b* may be equal to the distance DB between the plurality of first substrates 111. Specifically, the distance DF between two adjacent sub-substrates of the plurality of sub-substrates 820*a* and 820*b* may be equal to the distance DB between two adjacent first substrates 111 of the plurality of first substrates 111. Further, a distance DA is a distance between the sub-substrate 820*b* and the plurality of outermost first substrates 111*a*. The distance DA may be equal to the distance DF between the plurality of sub-substrates 820*a* and 820*b*. That is, the distance DF between two adjacent sub-substrates of the plurality of sub-substrates 820*a* and 820*b*, the distance DA between the sub-substrate 820*b* and the plurality of outermost first substrates 111*a*, and the distance DB between the plurality of first substrates 111 may be equal to each other.

The stretchable display device 800 may further include an eighth connection line 888. The eighth connection line 888 may connect sub-substrates of the plurality of second substrates 820 disposed adjacent to each other in the X-axis direction. The eighth connection line 888 serves to connect the first gate driver GD1 in the sub-substrate 820*a* disposed in the outermost region of the non-active area NA to the second gate driver GD2 in the sub-substrate 820*b* closest to the plurality of outermost first substrates 111*a*.

In the stretchable display device 800 according to one or more embodiments of the present disclosure, the plurality of second substrates 820 includes the plurality of sub-substrates 820a and 820b. Thus, when the stretchable display device 800 is stretched, stress concentrated on the plurality of second substrates 820 and the third connection line 183 can be reduced because the stress is distributed to multiple sub-substrates instead of a single second substrate 820. Specifically, the plurality of second substrates 820 include the plurality of sub-substrates 820a and 820b, which are equal in size to the plurality of first substrates 111. Also, the distance between the plurality of first substrates 111 disposed in the lower substrate 110 and the distance between the plurality of sub-substrates 820a and 820b may be equal to each other. Therefore, in the stretchable display device 800 according to one or more embodiments of the present disclosure, it is possible to suppress the concentration of stress on the largest substrates and lines connecting thereto. Such concentration is caused by a difference in size between substrates disposed in the lower substrate 110. Accordingly, when the stretchable display device 800 is stretched, stress concentrated on the plurality of second substrates 820 and the third connection line 183 can be reduced. Thus, the likelihood of damage to the plurality of second substrates 820 and the third connection line 183 can be minimized.

Figure 9:
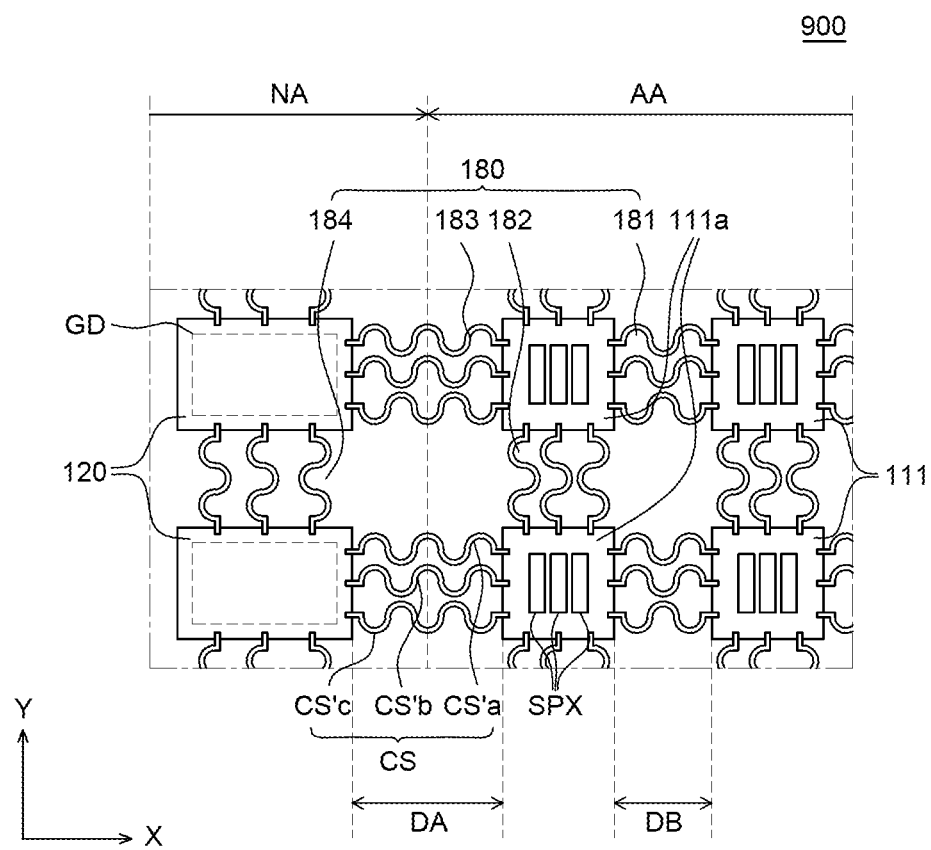
FIG. 9 is an enlarged plan view illustrating a portion of a stretchable display device according to one or more embodiments of the present disclosure.

FIG. 9 is an enlarged plan view illustrating a stretchable display device 900 according to one or more embodiments of the present disclosure. The stretchable display device 900 shown in FIG. 9 is substantially the same in some respects as the stretchable display device 100 shown in FIG. 1 through FIG. 3 except for a plurality of connection supports CS' (which may also be referred to herein as a plurality of third substrates CS'). Therefore, redundant description of similar components will be omitted.

Referring to FIG. 9, the plurality of third substrates CS' includes at least a pair of third substrates CS' symmetrical to each other. In one or more embodiments, three third substrates CS' are disposed between the plurality of first substrates 111, between the plurality of second substrates 120, and between the plurality of first substrates 111 and the plurality of second substrates 120. As such, a third substrate CS'a and a third substrate CS'b adjacent to the third substrate CS'a may be waved in the same direction. In other words, the third substrates CS'a and CS'b may have the same sine wave shape. Further, the third substrate CS'b and a third substrate CS'c of the plurality of third substrates CS' may be waved symmetrically to each other. In other words, the third substrate CS'c may have a wave shape that is inverted relative to the third substrates CS'a and CS'b. As such, troughs of the wave shape of the third substrate CS'c align with peaks of the wave shape of the third substrates CS'a and CS'b in a mirrored configuration. FIG. 9 illustrates three third substrates CS'. However, the present disclosure is not limited thereto.

When a stretchable display device is stretched, stress is concentrated on the edges of a plurality of first substrates and a plurality of second substrates. If a plurality of third substrates and connection lines are disposed and waved in the same direction, at least one of the plurality of third substrates may be disposed adjacent to the edges of the plurality of first substrates and the plurality of second substrates. Thus, when the stretchable display device is stretched, stress is concentrated on the plurality of third substrates and the connection lines disposed in the plurality of first substrates and the plurality of second substrates. Therefore, the plurality of third substrates and the connection lines may be susceptible to damage.

However, in the stretchable display device 900 according to one or more embodiments of the present disclosure, at least a pair of third substrates CS'b and CS'c of the plurality of third substrates CS' are disposed symmetrically to each other, or are mirror images of each other. Thus, the number of the third substrates CS' and the connection lines 180 disposed on the edges of the plurality of first substrates 111 and the plurality of second substrates 120 can be reduced, which reduces the likelihood of damage to the plurality of third substrates CS' and the connection lines 180.

Figure 10:
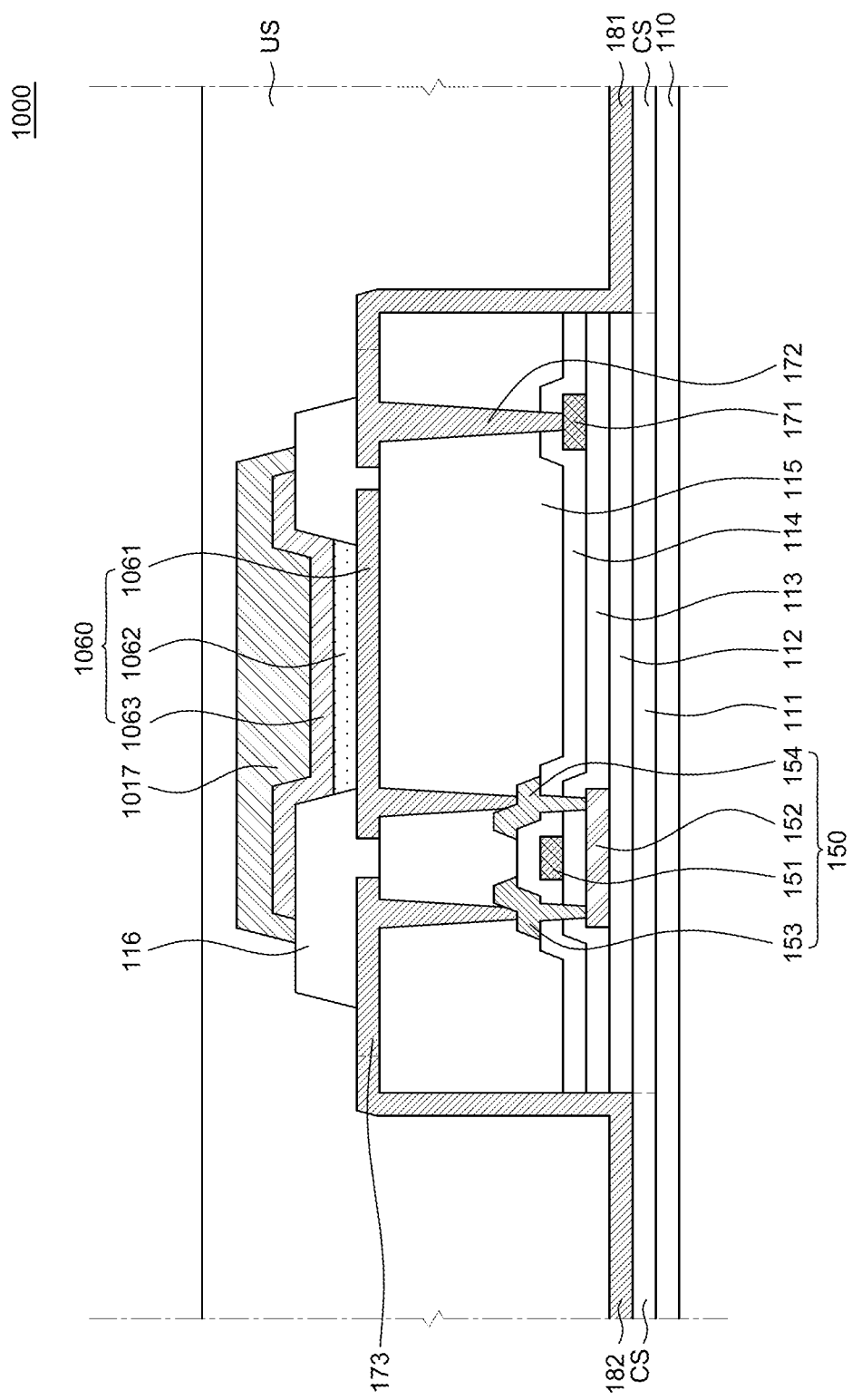
FIG. 10 is a schematic cross-sectional view illustrating a sub-pixel of a stretchable display device according to one or more embodiments of the present disclosure.

FIG. 10 is a schematic cross-sectional view illustrating a sub-pixel of a stretchable display device 1000 according to one or more embodiments of the present disclosure. The stretchable display device 1000 shown in FIG. 10 is substantially the same in some respects as the stretchable display device 100 shown in FIG. 1 through FIG. 3, except for an organic light-emitting diode (OLED) 1060. Therefore, redundant description of similar components will be omitted.

Referring to FIG. 10, the OLED 1060 is disposed corresponding to each of the plurality of sub-pixels SPX and emits light in a specific wavelength range. That is, the OLED 1060 may be a blue OLED that emits blue light, a red OLED that emits red light, a green OLED that emits green light, or a white OLED that emits white light, but is not limited thereto. If the OLED 1060 is a white OLED, the stretchable display device 1000 may further include a color filter.

The OLED 1060 includes an anode 1061, an organic emission layer 1062, and a cathode 1063. Specifically, the anode 1061 is disposed on the overcoating or planarizing layer 115. The anode 1061 is an electrode configured to supply holes into the organic emission layer 1062. The anode 1061 may be formed of a transparent conductive material having high work function. The transparent conductive material may include indium tin oxide (ITO), indium zinc oxide (IZO), and indium tin zinc oxide (ITZO), among others. The anode 1061 may be formed of the same material as the data pad 173 and the gate pad 171 disposed on the overcoating layer 115, but is not limited thereto. Further, if the stretchable display device 1000 is of top-emission type, the anode 1061 may further include a reflective plate.

The anode 1061 is disposed spaced from each sub-pixel SPX and is electrically connected to the transistor 150 through the contact hole in the overcoating layer 115. For example, FIG. 10 illustrates that the anode 1061 is electrically connected to the drain electrode 154 of the transistor 150, but the anode 1061 may be electrically connected to the source electrode 153 in other embodiments.

The bank 116 is formed on the anode 1061, the data pad 173, the intermediate pad 172, and the overcoating layer 115. The bank 116 separates adjacent sub-pixels SPX from each other. The bank 116 is disposed to cover at least a portion of both sides of the adjacent anode 1061 and exposes a portion of an upper surface of the anode 1061. The bank 116 may serve to suppress light emission of unintended sub-pixels SPX or color mixing which occurs when light is emitted from the sides of the anode 1061 due to concentration of current on the edges of the anode 1061. The bank 116 may be formed of acryl-based resin, benzocyclobutene (BCB)-based resin, or PI, but is not limited thereto.

The bank 116 includes a contact hole for connecting the connection line 180 serving as a data line and the data pad 173 and a contact hole for connecting the connection line 180 serving as a gate line and the intermediate pad 172.

The organic emission layer 1062 is disposed on the anode 1061. The organic emission layer 1062 is configured to emit light. The organic emission layer 1062 may contain a light-emitting material, and the light-emitting material may include a phosphorescent material or a fluorescent material, but is not limited thereto.

The organic emission layer 1062 may be formed as a single emission layer. Otherwise, the organic emission layer 1062 may have a stack structure in which a plurality of emission layers laminated on each other with a charge generation layer interposed therebetween. Further, the organic emission layer 1062 may further include at least one organic layer of a hole transport layer, an electron transport layer, a hole block layer, an electron block layer, a hole injection layer, and an electron injection layer.

Referring to FIG. 10, the cathode 1063 is disposed on the organic emission layer 1062. The cathode 1063 is configured to supply electrons into the organic emission layer 1062. The cathode 1063 may be formed of a transparent conductive oxide such as ITO, IZO, ITZO, zinc oxide (ZnO), and tin oxide (TO) or an ytterbium (Yb) alloy. Otherwise, the cathode 1063 may be formed of a metal material.

The cathode 1063 may be patterned to overlap each of the plurality of first substrates 111. In other words, the cathode 1063 may be formed only in a region corresponding to the plurality of first substrates 111 and may not be formed in a region between the plurality of first substrates 111. The cathode 1063 is formed of a transparent conductive oxide, a metal material, or the like. Thus, if the cathode 1063 is formed between the plurality of first substrates 111, the cathode 1063 may be susceptible to damage while the stretchable display device 1000 is stretched. Thus, the cathode 1063 may be formed so as to correspond to each of the plurality of first substrates 111. Referring to FIG. 10, the cathode 1063 may be formed in the region overlapping the plurality of first substrates 111 so as not to overlap the connection lines 180.

Unlike known organic light-emitting display devices, the stretchable display device 1000 according to one or more embodiments of the present disclosure includes the cathodes 1063 patterned corresponding to the plurality of first substrates 111. Therefore, the cathodes 1063 respectively disposed on the plurality of first substrates 111 can be independently supplied with low-potential power through the connection lines 180.

Referring to FIG. 10, an encapsulation layer 1017 is disposed on the OLED 1060. The encapsulation layer 1017 covers the OLED 1060 and is in contact with a portion of an upper surface of the bank 116 and thus seals the OLED 1060. Thus, the encapsulation layer 1017 protects the OLED 1060 against permeation of moisture or air from the outside or physical impacts.

The encapsulation layer 1017 covers the cathodes 1063 patterned to overlap the plurality of first substrates 111, respectively, and may be formed for each of the plurality of first substrates 111. That is, the encapsulation layer 1017 may be disposed to cover a single cathode 1063 disposed on a single first substrate 111, and the encapsulation layers 1017 disposed on the respective first substrates 111 may be spaced apart from each other.

The encapsulation layer 1017 may be formed only in the region overlapping the plurality of first substrates 111. As described above, the encapsulation layer 1017 may include an inorganic layer. Therefore, the encapsulation layer 1017 may be susceptible to damage, such as cracks, when the stretchable display device 1000 is stretched. Particularly, since the OLED 1060 is vulnerable to moisture or oxygen, if the encapsulation layer 1017 is damaged, the reliability of the OLED 1060 may be reduced. Therefore, in the stretchable display device 1000 according to one or more embodiments of the present disclosure, the encapsulation layer 1017 is not formed in the region between the plurality of first substrates 111. Thus, even when the stretchable display device 1000 is deformed by bending or stretching, it is possible to minimize damage to the encapsulation layer 1017.

Figure 11A:
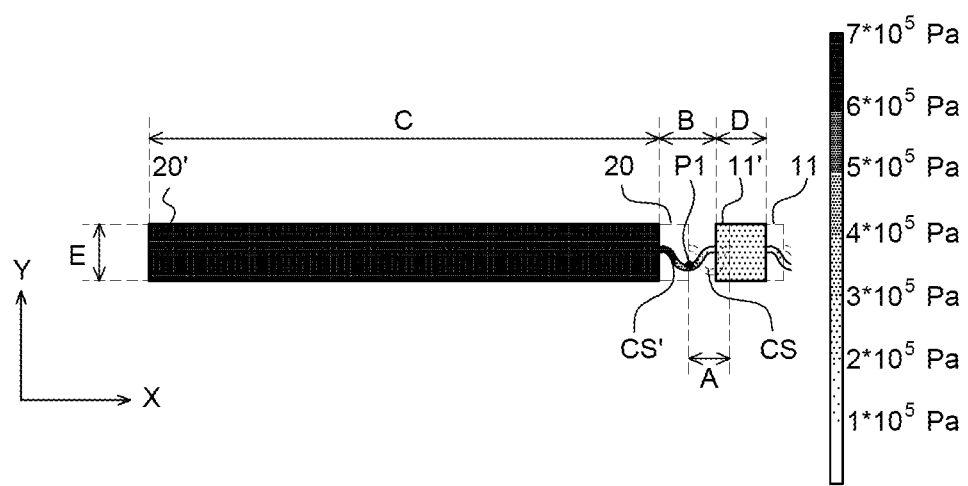
FIG. 11A through FIG. 11C are stress simulation images of stretchable display devices according to embodiments of the present disclosure and a Comparative Example.
Figure 11B:
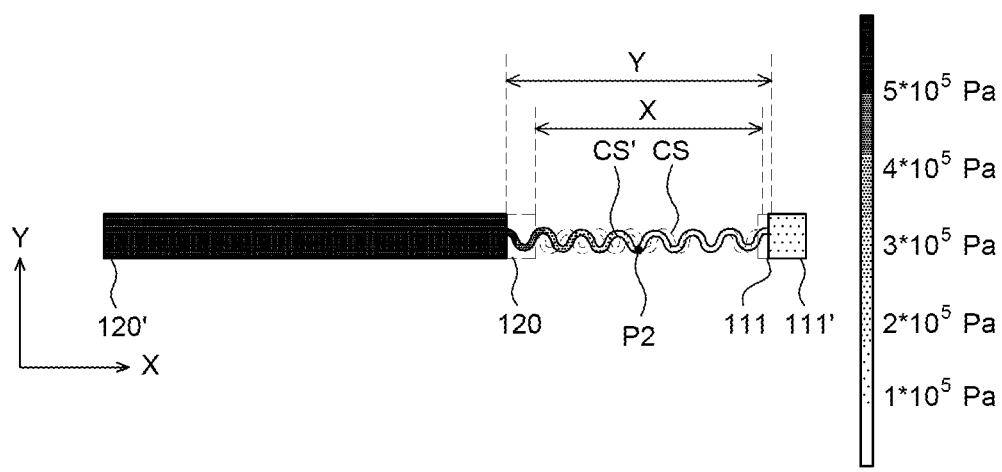
Figure 11C:
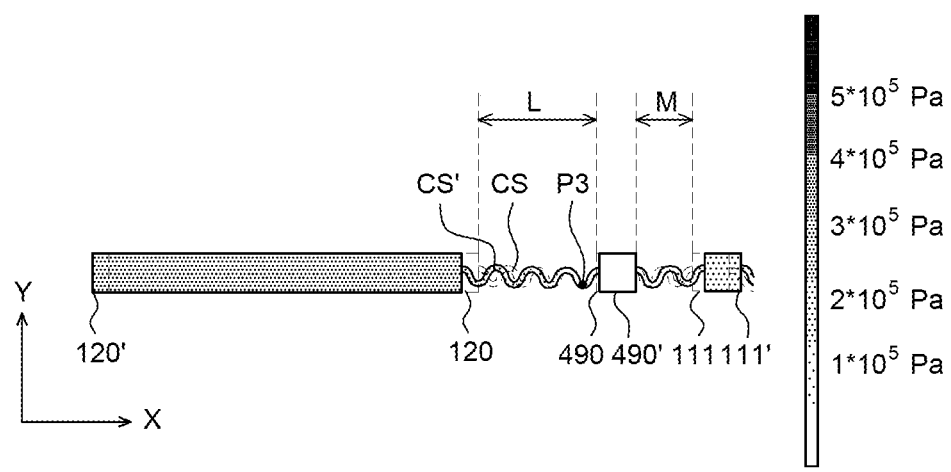

FIG. 11A through FIG. 11C are images respectively illustrating simulations of stress in stretchable display devices according to a Comparative Example and one or more embodiments of the present disclosure. Specifically, FIG. 11A illustrates a simulation of stress which is generated when a stretchable display device according to the Comparative Example is stretched. FIG. 11B illustrates a simulation of stress which is generated when the stretchable display device 100 according to one or more embodiments of the present disclosure is stretched. FIG. 11C illustrates a simulation of stress which is generated when the stretchable display device 400 according to alternative embodiments of the present disclosure is stretched.

In FIG. 11A through FIG. 11C, the amounts of stress are expressed by color based on middle points P1, P2, and P3 between first substrates 11 and 111 and second substrates 20 and 120, respectively. The middle points P1, P2, and P3 are set as reference points for stress. Also, stress values Pa corresponding to the respective colors are shown on the right bar for comparison.

In FIG. 11A through FIG. 11C, a solid-line portion denotes the configuration before stretching, and a dashed line portion denotes the configuration after stretching with a stretch rate of 20% in the Y-axis direction. Therefore, in FIG. 11A, if a distance between the first substrate 11 and the second substrate 20 before stretching is A, a distance B between the first substrate 11 and the second substrate 20 after stretching is 1.2 A. Further, in FIG. 11B, if a distance between the first substrate 111 and the second substrate 120 before stretching is X, a distance Y between the first substrate 111 and the second substrate 120 after stretching is 1.2 X. In FIG. 11C, X and Y are not shown. However, the distance between the first substrate 111 and the second substrate 120 before stretching in FIG. 11B is equal to a distance between the first substrate 111 and the second substrate 120 before stretching in FIG. 11C. Also, the distance between the first substrate 111 and the second substrate 120 after stretching in FIG. 11B is equal to a distance between the first substrate 111 and the second substrate 120 after stretching in FIG. 11C.

In FIG. 11A through FIG. 11C, the first substrates 11 and 111, the second substrates 20 and 120, the third substrate CS, and the fourth substrate 490 are formed of PI and have a thickness of 6 μm. Also, it is assumed that lines made of copper (Cu) are formed to a thickness of 5000 Å on the first substrates 11 and 111, the second substrates 20 and 120, the third substrate CS, and the fourth substrate 490 in a similar manner to the connection lines 180 and 480.

In FIG. 11A through FIG. 11C, the reference numerals for the first substrates 11 and 111, the second substrates 20 and 120, the third substrate CS, and the fourth substrate 490 are added with an apostrophe (') to denote the stretched configuration.

In FIG. 11A through FIG. 11C, the first substrates 11 and 111 are equal in size to each other, and the second substrates 20 and 120 are also equal in size to each other. Herein, an X-axis directional width D and a Y-axis directional width E of the first substrates 11 and 111 are equal to each other. Further, the Y-axis directional width E of the first substrates 11 and 111 is equal to a Y-axis direction width E of the second substrates 20 and 120. However, an X-axis direction width C of the second substrates 20 and 120 is nine times greater than the X-axis directional width D of the first substrates 11 and 111.

In the stretchable display device 100 according to one or more embodiments of the present disclosure shown in FIG. 11B, X denotes a distance between the first substrate 111 and the second substrate 120. In the stretchable display device according to the Comparative Example shown in FIG. 11A, B denotes a distance between the first substrate 11 and the second substrate 20. The distance X is seven times greater than the distance B. In FIG. 11C, X and Y are not shown. However, a distance between the first substrate 111 and the second substrate 120 in the stretchable display device 400 according to alternative embodiments of the present disclosure shown in FIG. 11C is also seven times greater than the distance B.

In the stretchable display device 400 according to one or more embodiments of the present disclosure shown in FIG. 11C, if an X-axis directional width of the fourth substrate 490 is 1, a distance M between the fourth substrate 490 and the first substrate 111 is equal to 2. Also, a distance L between the fourth substrate 490 and the second substrate 120 is equal to 4.

First, FIG. 11A shows that when the stretchable display device according to the Comparative Example is stretched, very high stress of about $7 \times 10^5$ Pa is generated on the second substrate 20'. Also, FIG. 11A shows that very high stress is also generated on the connection substrate CS' adjacent to the second substrate 20'.

Next, referring to FIG. 11B, the distance between the first substrate 111 and the second substrate 120 in the stretchable display device 100 according to one or more embodiments of the present disclosure is seven times greater than the distance between the first substrate 11 and the second substrate 20 in the stretchable display device according to the Comparative Example. Thus, FIG. 11B shows that when the stretchable display device 100 is stretched, stress of about $5 \times 10^5$ Pa is generated on the second substrate 120'. Also, FIG. 11B shows that stress similar in amount to the stress on the second substrate 120' is also generated on the connection substrate CS' adjacent to the second substrate 120'. Therefore, much lower stress is generated in the stretchable display device 100 according to one or more embodiments of the present disclosure than in the stretchable display device according to the Comparative Example.

Next, referring to FIG. 11C, the distance between the first substrate 111 and the second substrate 120 in the stretchable display device 400 according to one or more embodiments of the present disclosure is seven times greater than the distance between the first substrate 11 and the second substrate 20 in the stretchable display device according to the Comparative Example. Further, the fourth substrate 490 is added between the first substrate 111 and the second substrate 120. Thus, FIG. 11C shows that when the stretchable display device 400 is stretched, stress of about $3 \times 10^5$ Pa is generated on the second substrate 120'. Also, FIG. 11C shows that stress similar in amount to the stress on the second substrate 120' is also generated on the connection substrate CS' adjacent to the second substrate 120'. Therefore, much lower stress is generated in the stretchable display device 400 according to one or more embodiments of the present disclosure than in the stretchable display device according to the Comparative Example.

Although the embodiments of the present disclosure have been described in detail with reference to the accompanying drawings, the present disclosure is not limited thereto and may be embodied in many different forms without departing from the technical concept of the present disclosure. Therefore, the embodiments of the present disclosure are provided for illustrative purposes only and are not intended to limit the technical concept of the present disclosure. The scope of the technical concept of the present disclosure is not limited thereto. Therefore, it should be understood that the above-described embodiments are illustrative in all aspects and do not limit the present disclosure. The protective scope of the present disclosure should be construed based on the following claims, and all the technical concepts in the equivalent scope thereof should be construed as falling within the scope of the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A stretchable display assembly, comprising:
    a support substrate including an active area and a non-active area;
    a plurality of first substrates on the support substrate in the active area, each of the plurality of first substrates including:
        a transistor;
        a planarizing layer on the transistor; and
        a connection line on the planarizing layer connected to the transistor; and
    a plurality of second substrates on the support substrate in the non-active area,
    wherein a distance between respective substrates of the plurality of first substrates in an outermost region of the active area and respective substrates of the plurality of second substrates in the non-active area is greater than a distance between respective substrates of the plurality of first substrates in the active area.

2. The stretchable display device of claim 1 further comprising:
    a plurality of connection supports coupled to the plurality of first substrates and the plurality of second substrates, wherein the connection line of each of the plurality of first substrates is on one of the plurality of connection supports, wherein the plurality of connection supports are stretchable.

3. The stretchable display device of claim 2 wherein the connection line of a first one of the plurality of first substrates is connected to the connection line of a second one of the plurality of first substrates.

4. The stretchable display device of claim 3 wherein the connection line of the first one of the plurality of first substrates is connected to a corresponding one of the plurality of second substrates.

5. The stretchable display device of claim 2 wherein a first one of the plurality of connection supports has a sine wave shape and a second one of the plurality of connection supports has an inverted sine wave shape.

6. The stretchable display device of claim 1 wherein each of the plurality of second substrates includes a first portion and a second portion spaced from the first portion with a distance between the first portion and the second portion being equal to a distance between a first one of the plurality of first substrates and a second one of the plurality of second substrates.

7. The stretchable display device of claim 1 further comprising:
   a plurality of third substrates; and
   a plurality of connection supports coupled to the plurality of first substrates, the plurality of second substrates, and the plurality of third substrates.

8. The stretchable display device of claim 7 wherein each of the plurality of second substrates have a first width, a first one of the plurality of third substrates has a second width, a second one of the plurality of third substrates has a third width, and each of the plurality of first substrates have a fourth width, the first width being greater than the second width, the third width, and the fourth width.

9. The stretchable display device of claim 8 wherein the second width is greater than the third width and the third width is equal to the fourth width.

10. The stretchable display device of claim 8 wherein the second width, the third width, and the fourth width are equal.

\* \* \* \* \*